(12) United States Patent
Kurokawa et al.

(10) Patent No.: US 6,621,130 B2
(45) Date of Patent: Sep. 16, 2003

(54) SEMICONDUCTOR DEVICE AND AN ELECTRONIC DEVICE

(75) Inventors: Yoshiyuki Kurokawa, Kanagawa (JP); Kiyoshi Kato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/156,512

(22) Filed: May 28, 2002

(65) Prior Publication Data
US 2002/0185692 A1 Dec. 12, 2002

(30) Foreign Application Priority Data
May 31, 2001 (JP) ........................................ 2001-165480

(51) Int. Cl.$^7$ ............................................. H01L 31/119
(52) U.S. Cl. ........................ 257/390; 257/314; 257/315; 257/495; 257/29.129
(58) Field of Search ................................. 257/390, 314, 257/315, 29.129, 495, 316–320

(56) References Cited

U.S. PATENT DOCUMENTS

| | | | | |
|---|---|---|---|---|
| 5,065,201 A | * | 11/1991 | Yamauchi | 257/315 |
| 5,449,941 A | | 9/1995 | Yamazaki et al. | 257/411 |
| 5,455,793 A | * | 10/1995 | Amin et al. | 257/315 |
| 5,629,222 A | | 5/1997 | Yamazaki et al. | 438/259 |
| 5,777,359 A | * | 7/1998 | Ra | 257/314 |
| 5,883,832 A | * | 3/1999 | Tempel et al. | 365/185.18 |
| 5,929,480 A | * | 7/1999 | Hisamune | 257/320 |
| 5,973,357 A | * | 10/1999 | Uenoyama et al. | 257/321 |
| 6,057,575 A | * | 5/2000 | Jenq | 257/319 |
| 6,147,379 A | * | 11/2000 | Hori et al. | 257/317 |
| RE37,199 E | * | 5/2001 | Yamauchi | 438/264 |
| 6,335,716 B1 | | 1/2002 | Yamazaki et al. | 345/92 |
| 6,376,875 B1 | * | 4/2002 | Kakoschke et al. | 257/315 |

FOREIGN PATENT DOCUMENTS

| | | | |
|---|---|---|---|
| EP | 0573170 A1 | * 5/1993 | ........... H01L/21/82 |
| JP | 2691383 | 9/1997 | |
| JP | 2691385 | 9/1997 | |
| JP | 11-143379 | 5/1999 | |

OTHER PUBLICATIONS

English abstract re Japanese Patent Application No. 5–206412 published Sep. 5, 1997.
English Abstract re Japanese Patent Application No. 5–206412 published Sep. 5, 1997.
English Abstract re Japanese Patent Application No. 11–143379 published May 28, 1999.

* cited by examiner

Primary Examiner—Jasmine J B Clark
(74) Attorney, Agent, or Firm—Cook., Alex, McFarron, Manzo, Cummings & Mehler, Ltd.

(57) ABSTRACT

The present invention provides a semiconductor nonvolatile memory in which writing or erasing of storing information can be carried out at a high speed with low consumption power and in which dispersion width of a threshold voltage after writing or erasing is very narrow.

A channel region of a memory transistor is divided into two regions of a writing control region and a writing region. The writing control region and the writing region have different threshold voltages. Writing is only carried out in the writing region. The writing control region turns off when the amount of electric charges accumulated in a floating gate reaches a specific value due to writing. The writing control region is used as a switch for a writing operation to automatically stop writing. Accordingly, an involatile memory comprising a memory transistor, in which writing can be carried out at a high speed with low consumption power and which is superior in controlling a threshold voltage after writing or erasing, can be obtained.

14 Claims, 11 Drawing Sheets

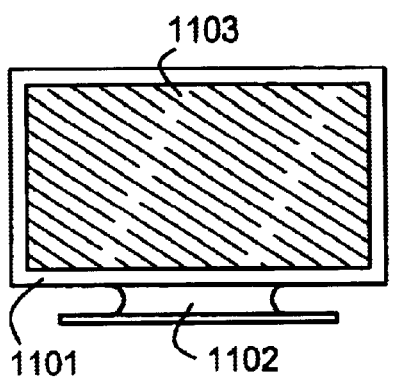
FIG. 11A
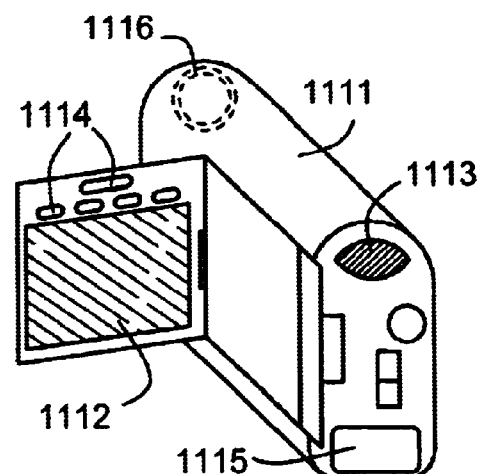
FIG. 11B
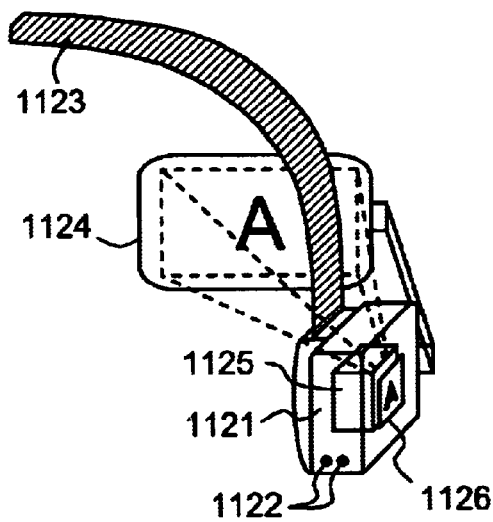
FIG. 11C
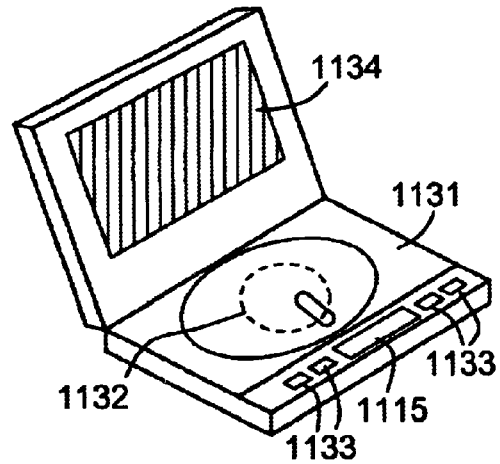
FIG. 11D
FIG. 11E
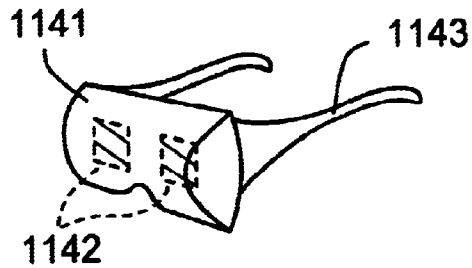
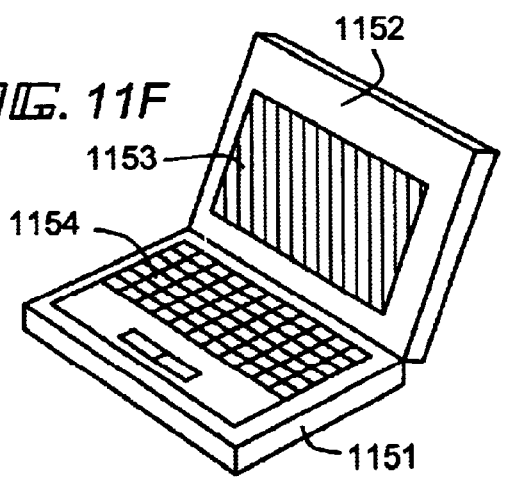
FIG. 11F

SEMICONDUCTOR DEVICE AND AN ELECTRONIC DEVICE

BACKGROUND OF THE INVENTION

1. Field of the Invention

The present invention relates to a semiconductor nonvolatile memory, particularly, a semiconductor nonvolatile memory in which writing and erasing can be electrically carried out (an electrically erasable and programmable read only memory referred to as EEPROM, hereinafter). The invention is also relates to a semiconductor device.

2. Description of the Related Art

An electrically erasable and programmable nonvolatile memory (EEPROM) is known as a memory representing semiconductor nonvolatile memories. An EEPROM is a nonvolatile memory and different from a DRAM (dynamic random access memory) and an SRAM (static RAM), which represent other semiconductor memories. Therefore, data in the EEPROM would not be lost even when a power source turns off. Further, the EEPROM has a characteristic superior in integration density, ballistic resistance, consumption power, and writing/reading speed, compared with a magnetic disc representing the nonvolatile memories other than the above EEPROM. Due to such characteristic, a trend using an EEPROM as a substitute for various memories such as a magnetic disc and a DRAM has been increased, and further development in future is expected.

Information (storing information) in an EEPROM can be written and erased by charge injection to or drawing from a floating gate of each memory transistor. The storing information is discriminated by means of a threshold voltage corresponding to the amount of electric charges accumulated in the floating gate. Thus, it is important to control the threshold voltage after writing or erasing in order to accurately read out storing information of an EEPROM. To inject an electron to the floating gate of a memory transistor so as to increase the threshold voltage is referred to as writing in this specification. On the other hand, to draw an electron from the floating gate of a memory transistor so as to reduce the threshold voltage is referred to as erasing.

In each memory transistor constituting an EEPROM, a threshold voltage thereof is respectively different after writing or erasing even when writing or erasing is carried out at a same applied voltage for a same time period. This is because the speed of each memory transistor in writing or erasing is respectively different. When the threshold voltage after writing or erasing is not within at predetermined range, wrong information is to be read out.

FIG. 2A shows a relation between the writing time and the threshold voltage when writing is carried out in a memory transistor. FIG. 2A also shows a memory transistor A in which writing speed is fast and a memory transistor B in which writing speed is slow. A threshold voltage after writing is distributed in the vicinity of a predetermined threshold voltage Vth when the writing time is set at t0. Thus, a reading-out voltage should be selected in view of dispersion width of a threshold voltage D0 in order to accurately read out information of a memory transistor.

A range for selecting a reading-out voltage is narrow when the dispersion width of a threshold voltage after writing or erasing is large. It is necessary to widen a space between threshold voltages in respective storing conditions in order to accurately read out information, which leads increase of a writing time or an erasing time. Further, consumption power is also increased in writing or erasing. This is a further serious problem in a multi-value memory transistor in which three or more values of information are stored. Therefore, there has been an idea to decrease the dispersion width of a threshold voltage after writing or erasing.

For example, manufacturing processes is improved to manufacture a memory transistor having a uniform characteristic so that the dispersion width of a threshold voltage after writing or erasing can be decreased. This corresponds to make a difference small in writing speed between the memory transistor A in which a writing speed is fast and the memory transistor B in which a writing speed is slow, as shown in FIG. 2B. The threshold voltage after writing is distributed in the vicinity of a predetermined threshold voltage Vth when the writing time is set at t1. Dispersion width D1 of the threshold voltage after writing in this case is smaller than dispersion width D0 shown in FIG. 2A. In order to make a characteristic of a memory transistor uniform, there are so many points for improving the manufacturing processes that there is a limit in making the dispersion width of the threshold voltage small only by improving the manufacturing processes.

In the case that a method for driving a circuit is devised to compensate a writing time or an erasing time at the same time as the improvement of the manufacturing processes, the dispersion width of the threshold voltage after writing or erasing can be further made small. In this method, the threshold voltage of a memory transistor is checked point by point to carry out writing or erasing, which is continued until the threshold voltage reaches a value within a predetermined range. This method is called verify-writing or verify-erasing.

FIG. 2C shows a relation between the writing time and the threshold voltage in performing the verify-writing. The writing speed of the memory transistor A in which the writing speed is fast and that of the memory transistor B in which the writing speed is slow are respectively same as those of FIG. 2B. A period for a writing operation, which is denoted by W, and a period for a reading-out operation and judgment of a threshold voltage, which is denoted by V, are alternately repeated. The writing operation is not performed when a read-out threshold voltage exceeds the predetermined threshold voltage Vth. The memory transistor A and the memory transistor B complete writing respectively at a writing time t2A and t2B. In this case, dispersion width D2 of a threshold voltage after writing can be made smaller than D1. There is, however, a disadvantage that the writing time increases due to a reading-out operation and judgment of a threshold voltage.

SUMMARY OF THE INVENTION

In view of the above, a purpose of the invention is to provide a memory transistor in which writing or erasing can be carried out at a high speed with low consumption power and which is superior in controlling a threshold voltage after writing or erasing.

According to the invention, in a memory transistor having a characteristic that a part of a channel region (a channel forming region) turns off when the amount of electric charges accumulated in a floating gate reaches a specific value, writing or erasing at a high speed with low consumption power is self-concluded. The dispersion width of a threshold voltage is accordingly made narrow after writing or erasing.

In the invention, a channel region of a memory transistor is divided into two: a writing control region (a first region);

and a writing region (a second region). The writing control region and the writing region are different in threshold voltage. Charge injection to a floating gate in a writing operation is only carried out in the writing region. The writing control region turns off when the amount of electric charges accumulated in the floating gate reaches a specific value in accordance with the charge injection. This characteristic can be used as a switch in a writing operation so that writing would be automatically stopped.

FIG. 3C shows a relation between the writing time and the threshold voltage (writing region) in the case of writing in a memory transistor according to the invention. FIG. 3A and FIG. 3B show a relation same as that of FIG. 2B and FIG. 2C, respectively, in the cases of writing and verify-writing in a certain time period described in paragraphs of the related art. In FIG. 3C, the writing speed of the a memory transistor A in which the writing speed is fast and that of a memory transistor B in which the writing speed is slow are respectively same as those of FIG. 3A and FIG. 3B. In FIG. 3C, writing automatically stops when a threshold voltage in the writing region reaches the predetermined threshold voltage Vth. The memory transistors A and B complete writing at the writing times t3A and t3B, respectively.

As shown in FIG. 3C, in a memory transistor according to the invention, dispersion width D3 of a threshold voltage after writing is almost equal to dispersion width of a difference in threshold voltage between the writing control region and the writing region, and therefore, does not depend on a difference in the writing speed of respective memory transistors. Thus, the dispersion width D3 of a threshold voltage after writing can be made smaller than the dispersion width D1 of a threshold voltage after writing for a certain time period shown in FIG. 3A. Furthermore, writing in a memory transistor according to the invention is superior to the verify-writing in consumption power and writing time since it is not necessary to carry out a reading-out operation and judgment of a threshold voltage.

The invention provides a semiconductor device provided with a plurality of memory transistors comprising:
a semiconductor comprising a source region, a drain region and a channel forming region;
a first insulating film formed on the semiconductor;
a floating gate formed on the first insulating film;
a second insulating film formed on the floating gate; and
a control rate formed on the second insulating film.
The semiconductor device comprising:
a first and a second regions in the channel forming region, and
means for intercepting charge injection from the first region to the floating gate (referred to as a first means, hereinafter);
means for carrying out charge injection from the second region to the floating gate (referred to as a second means, hereinafter); and
means for stopping charge injection from the second region to the floating gate (referred to as a third means, hereinafter).
Furthermore, the semiconductor device comprising:
a first and a second regions in the channel forming region, and
means for intercepting charge drawing from the floating gate to the first region (referred to as a fourth means, hereinafter);
means for carrying out charge drawing from the floating gate to the second region (referred to as a fifth means, hereinafter); and
means for stopping charge drawing from the floating gate to the second region (referred to as a sixth means, hereinafter).

The first and third means and the fourth and the sixth means correspond to a piled layer comprising the first region included in the channel forming region, the first insulating film formed on the first region, the floating gate formed on the first insulating film, the second insulation film formed on the floating gate and the control gate formed on the second insulating film. They also correspond to voltages applied to the source region, the drain region and the control gate as well as the amount of electric charges held in the floating gate.

The second and the fifth means correspond to a piled layer comprising the second region included in the channel forming region, the first insulating film formed on the second region, the floating gate formed on the first insulating film, the second insulating film formed on the floating gate and the control gate formed on the second insulating film. They also correspond to voltages applied to the source region, the drain region and the control gate as well as the amount of electric charges held in the floating gate.

The invention provides a semiconductor device provided with a plurality of memory cells to which first and second memory transistors are connected in series, the memory transistors respectively comprising:
a semiconductor comprising a source region, a drain region and a channel forming region;
a first insulating film formed on the semiconductor;
a floating gate formed on the first insulating film;
a second insulating film formed on the floating gate; and
a control gate formed on the second insulating film,
wherein the floating gates of the first and second memory transistors are connected respectively, and
wherein the control gates of the first and second memory transistors are connected respectively.
The above semiconductor device comprising:
means for intercepting charge injection from the channel forming region of the first memory transistor to the floating gate (referred to as a seventh means, hereinafter);
means for carrying out charge injection from the channel forming region of the first memory transistor to the floating gate (referred to as an eighth means, hereinafter); and
means for stopping charge injection from the channel forming region of the second memory transistor to the floating gate (referred to as a ninth means, hereinafter).
Furthermore, the semiconductor device comprising:
means for intercepting charge drawing from the floating gate to the channel forming region of the first memory transistor (referred to as a tenth means, hereinafter);
means for carrying out charge drawing from the floating gate to the channel forming region of the second memory transistor (referred to as an eleventh means, hereinafter); and
means for stopping charge drawing from the floating gate to the channel forming region of the second memory transistor (referred to as a twelfth means, hereinafter).

The seventh and ninth means and the tenth and the twelfth means correspond to a piled layer comprising the channel forming region of the first memory transistor, the first insulating film formed on the channel forming region, the floating gate formed on the first insulating film, the second insulation film formed on the floating gate and the control gate formed on the second insulating film. They also correspond to voltages applied to the source region, the drain region and the control gate of the first memory transistor as well as the amount of electric charges held in the floating gate of the first memory transistor.

The eighth and the eleventh means correspond to a piled layer comprising the channel forming region of the second memory transistor, the first insulating film formed on the channel forming region, the floating gate formed on the first insulating film, the second insulating film formed on the floating gate and the control gate formed on the second insulating film. They also correspond to voltages applied to the source region, the drain region and the control gate of the second memory transistor as well as the amount of electric charges held in the floating gate of the second memory transistor.

BRIEF DESCRIPTION OF THE DRAWINGS

FIG. 2A illustrates the above relation in the case of writing in a certain time period;

FIG. 2B illustrates the above relation in the case of writing in a certain time period (in which manufacturing processes have been improved);

FIG. 2C illustrates the above relation in the case of verify-writing;

FIG. 3A illustrates the above relation in the case of writing in a certain time period;

FIG. 3B illustrates the above relation in the case of verify-writing;

FIG. 3C illustrates the above relation in the case of writing in a memory transistor according to the invention;

FIGS. 11A through 11F illustrate electronic devices using a memory transistor according to the invention.

DETAILED DESCRIPTION OF THE INVENTION

THE MODE FOR CARRYING OUT THE INVENTION

In this embodiment mode, a typical element structure and a way of operation in a memory transistor according to the invention will be described.

[Embodiment Mode 1]

Figure 1A:
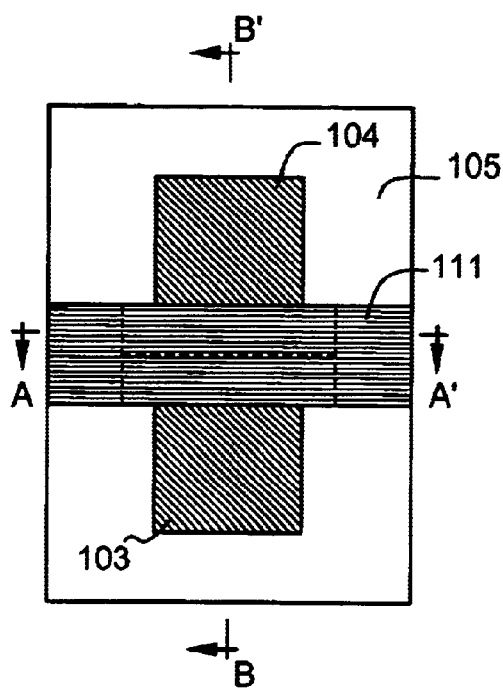
FIG. 1A is a plan view of an N type memory transistor in a first embodiment mode in this specification.
Figure 1B:
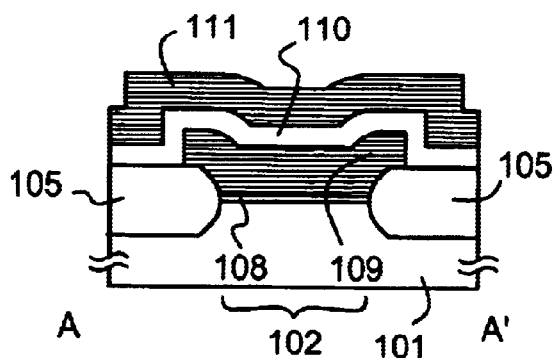
FIG. 1B is a sectional view along a line A–A' shown in FIG. 1A.
Figure 1C:
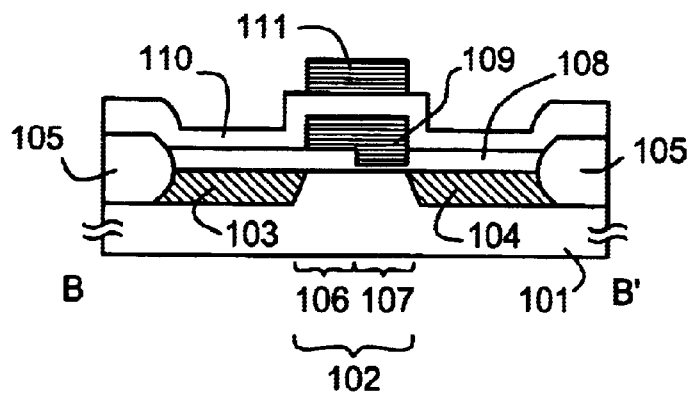
FIG. 1C is a sectional view along a line B–B' shown in FIG. 1A.
Figure 1D:
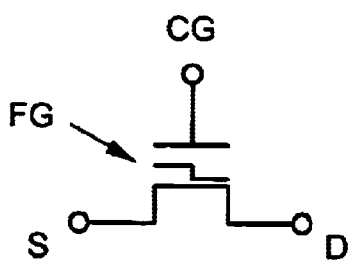
FIG. 1D shows an N type memory transistor by circuit marks.
Figure 2A:
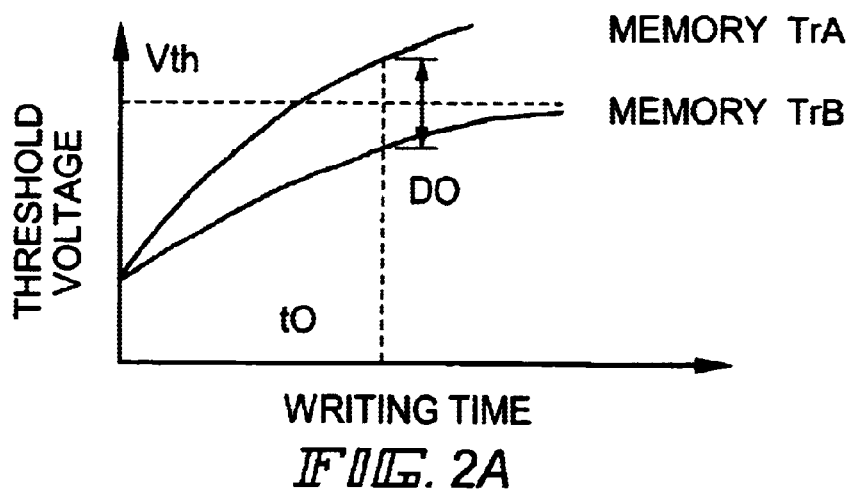
FIGS. 2A through 2C illustrate relations between a threshold voltage and a writing time in writing in a memory transistor.
Figure 2B:
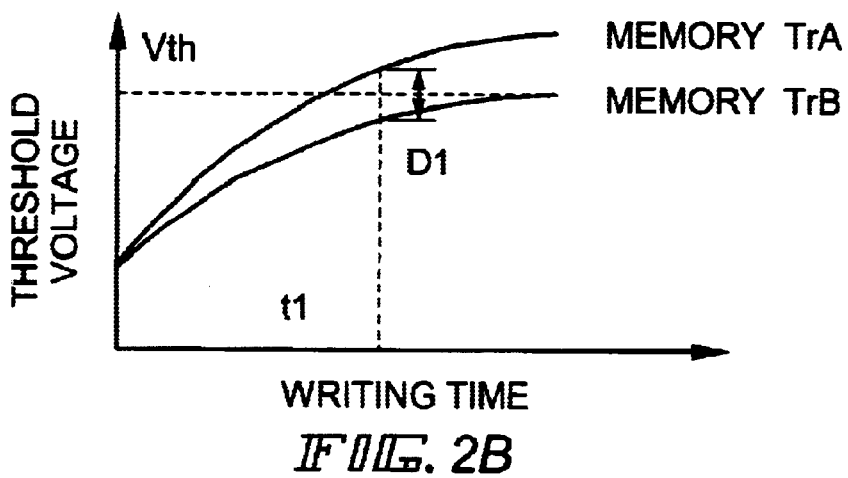
Figure 2C:
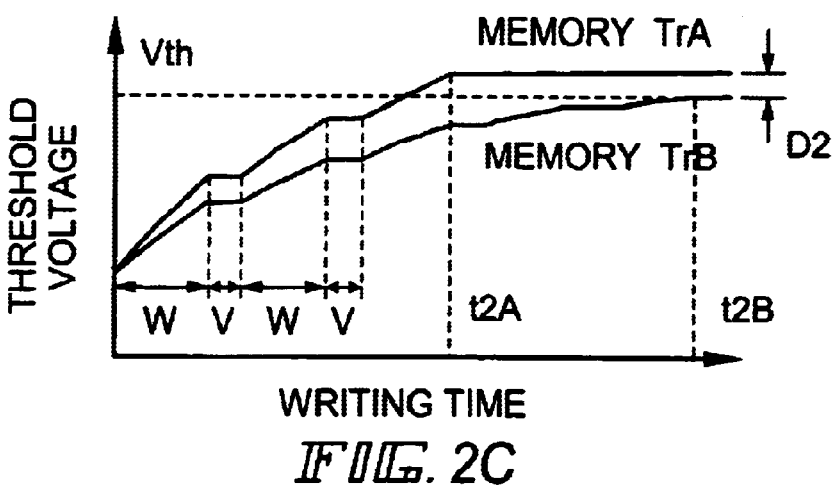
Figure 3A:
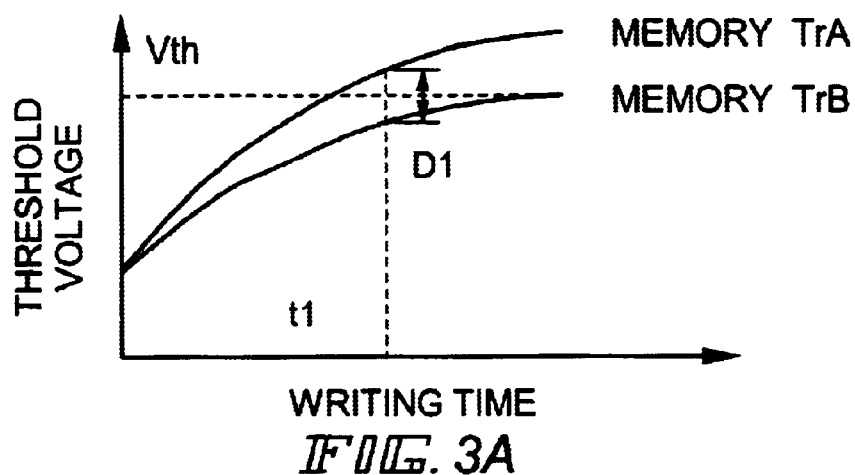
FIGS. 3A through 3C illustrate relations between a threshold voltage and a writing time in writing in a memory transistor.
Figure 3B:
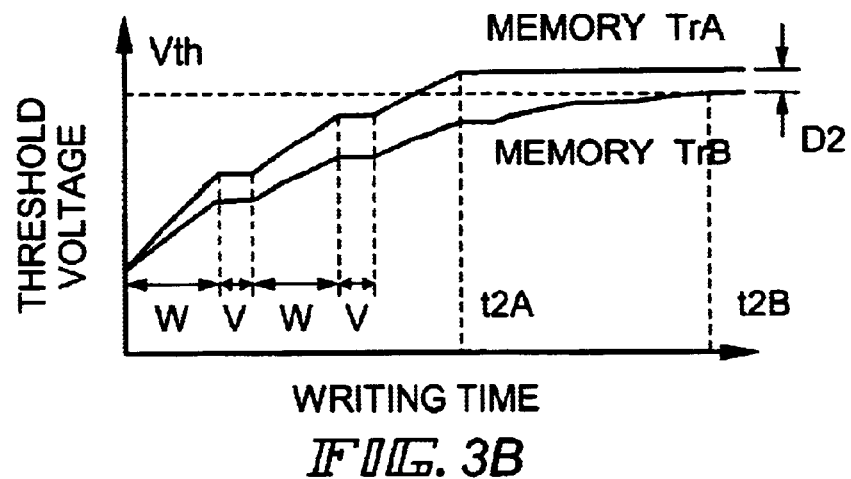
Figure 3C:
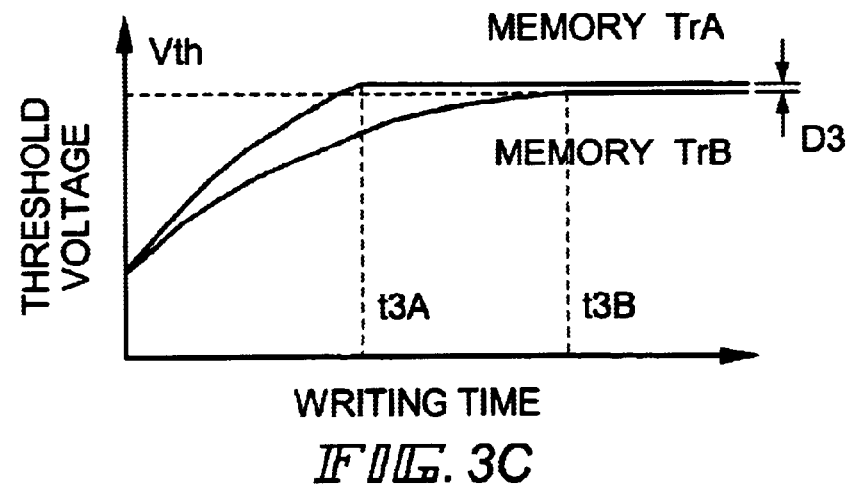

An N type of memory transistor in which writing is self-concluded will be described as an example of a memory transistor in the first mode for carrying out the invention. FIG. 1A is a plan view of a memory transistor in this mode. FIG. 1B is a sectional view along a line A–A' shown in FIG. 1A. FIG. 1C is a sectional view along a line B–B' shown in FIG. 1A. FIG. 1D shows a circuit mark.

In FIGS. 1A, 1B and 1C, a channel region 102, a source region 103 and a drain region 104 are formed on a single crystal substrate 101. The channel region 102, the source region 103 and the drain region 104 are collectively called an active layer. The active layer is surrounded by an element separation region 105 formed on the single crystal substrate 101. The channel region 102 comprises a writing control region 106 and a writing region 107. The source region 103 and the drain region 104 are N types of impurity region and formed by adding arsenic or phosphorus to the single crystal substrate 101.

A first insulating film (a tunnel oxide film) 108 is piled on the active layer. The tunnel oxide film 108 is provided thereon with a floating gate 109 on which a second insulating film 110 is piled. The second insulating film 110 is provided thereon with a control gate 111.

In a structure of a memory transistor in this mode, the floating gate 109 is inserted between the channel region 102 and the control gate 111 as well as in a conventional floating gate type of memory transistor, as shown in FIGS. 1A through 1D. A feature of the memory transistor in this mode is that the tunnel oxide film 108 in the writing region 107 is formed thinner than the tunnel oxide film 108 in the writing control region 106. Accordingly, charge injection to the floating gate 109 is substantially carried out only from the writing region 107.

In the above description of "between the channel region 102 and the control gate 111", the word "and" between the two regions means a range from the former region to the latter region.

In the writing control region 106 and the writing region 107, there is a difference provided in threshold voltage due to a difference in film thickness of the tunnel oxide film 108 and a difference in concentration of an impurity added to the channel region 102. The threshold voltage in a condition that no electric charge is accumulated in the floating gate 109 is Vthc0 in the writing control region 106 and Vtht0 in the writing region 107. In this mode, Vthc0 is 4 V and Vtht0 is 0 V hereinafter. Generally, the values may be Vthc0>Vtht0.

Next, a writing operation, a reading-out operation and an erasing operation of a memory transistor in this mode will be described. In the description of this mode, the writing operation is carried out by hot electron injection while the erasing operation is carried out by means of a tunnel current. The storing condition of the memory transistor after writing is set to be "1" and the threshold voltage in the writing region 107 is set to be 5.8 V to 6.2 V. The condition that no electric charge is accumulated in the floating gate or the condition after erasing is set to be "0" and the threshold voltage in the writing region 107 is set to be −3 V to 0 V. Description will be carried out hereinafter with reference to a circuit mark shown in FIG. 1D. An example of an operation voltage in the writing operation, the erasing operation and the reading-out operation (control gate potential VCG, drain potential VD and source potential VS) is shown in Table 1. Table 1 shows, of course, only an example of an operation voltage, which is not limited to the values shown in Table 1. A condition of a memory transistor before writing is set to be "0".

In order to carry out the writing operation, the source region 103 (a terminal S) is first connected to the GND. Positive potentials VCG (10 V, in this case) and VD (8 V, in this case) are applied to the control gate 111 (a terminal CG) And the drain region 104 (a terminal D), respectively.

When the above potential is applied, a hot electron generated in the vicinity of the drain region 104 is injected to the floating gate 109, so that the threshold voltages in the writing control region 106 and the writing region 107 rise up gradually. A channel of the writing control region 106 is closed at the moment when the threshold voltage Vthc in the writing control region 106 becomes equal to the VCG (10 V, in this mode). Then, the electric current does not flow between the source 103 and the drain 104 of a memory transistor, so that no hot electron would be generated in the vicinity of the drain region 104. Thus, no electric charge is injected to the floating gate 109. Writing is self-concluded accordingly. The threshold voltage Vtht in the writing region after writing is expressed by Vtht=Vtht0−Vthc0+VCG, which is 6 V in this mode.

As described above, in a memory transistor in the first embodiment mode in this specification, a threshold voltage in writing can be controlled so that the writing would be self-concluded. Dispersion width of the threshold voltage after writing does not depend on a difference in writing speed in each memory transistor. The dispersion width of the threshold voltage after writing is as narrow as that of a difference in threshold voltage between the writing control region and the writing region (Vtht0−Vthc0). The writing operation can be accordingly performed without checking a threshold voltage of the reading-out operation, so that a memory transistor would be superior to verify-writing in writing time and consumption power.

The terminal S is connected to the GND while 5 V is applied to the terminal CG when the reading-out operation is carried out. Further, small positive potential (1 V, in this case) is applied to the terminal D. In the case that a memory transistor is "0" here, the memory transistor turns on and an electric current flows between the source and the drain. On the other hand, in the case that a memory transistor is "1", the memory transistor turns off and no electric current flows between the source and the drain. Thus, storing information in the memory transistor can be read out by means of the electric current flowing between the source and the drain.

The terminal S is made to be in an electrically floating condition while the terminal D is connected to the GND when the erasing operation is carried out. Applying negative high potential (−20 V, in this case) to the terminal CG causes a tunnel current to flow from the floating gate 109 to the drain region 104, so that the electric charge would be drawn.

The operation voltage described above is only an example and the values are not limited to the above.

A method for writing is not limited to a hot electron injection method but may be a tunnel current method, as shown in a second embodiment mode.

It is possible to use a P type of memory transistor in which erasing is self-concluded although an N type of memory transistor in which writing is self-concluded is described in this mode. In the former case, the channel region comprises an erasing area and an erasing control region so that a threshold voltage in the erasing region would be higher than that of the erasing control region. Further, the thickness of a tunnel oxide film in the erasing area is made thinner than that of the erasing control region.

A P type memory transistor in which an erasing operation is carried out by using a tunnel current and is self-concluded will be described. Hereinafter, the description is provided by replacing the writing control region 106 and the wiring region 107 with an erasing control region and an erasing region respectively. Note that the threshold voltage in a condition before erasing is Vthc0 in the erasing control region and Vtht0 in the erasing region. In this embodiment mode the Vthc0 is 1V and Vtht0 is 7V. Generally, the values may be Vthc0<Vtht0.

The drain region is made to be in an electrically floating condition while the source region is connected to the GND. Applying negative potential VCG (−7V, in this case) to the control gate causes a tunnel current to flow from the floating gate to the source region, so that the electric charge would be drawn. A channel in the erasing control region is closed at the moment when the threshold voltage Vthc of the erasing control region becomes equal to the VCG (−7V in this case). Then, the electric current does not flow between the source and the drain of memory transistor, so that no electric charge is drawn from the floating gate. Erasing is self-concluded accordingly. The threshold voltage Vtht of the erasing region after erasing is expressed by Vtht=Vtht0−Vthc0+VCG, which is −1V in this embodiment mode.

Thus, according to the structure described in this mode, writing or erasing at a high speed with low consumption power can he performed and self-concluded so as to obtain a memory transistor in which controlling of a threshold voltage after writing or erasing is superior.

[Embodiment Mode 2]

Figure 4A:
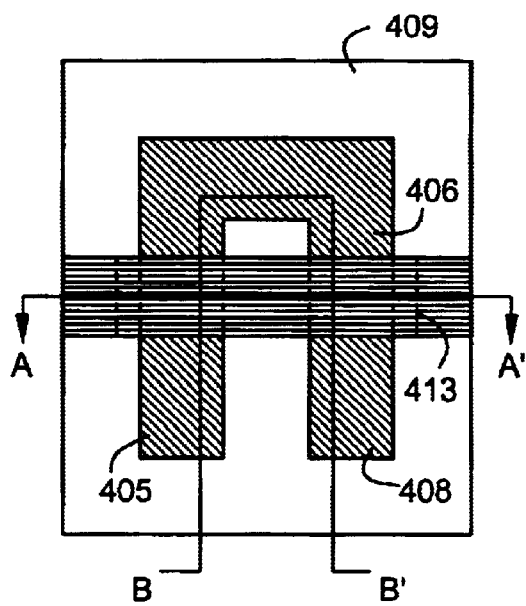
FIG. 4A is a plan view of an NN type memory transistor in a second embodiment mode in this specification.
Figure 4B:
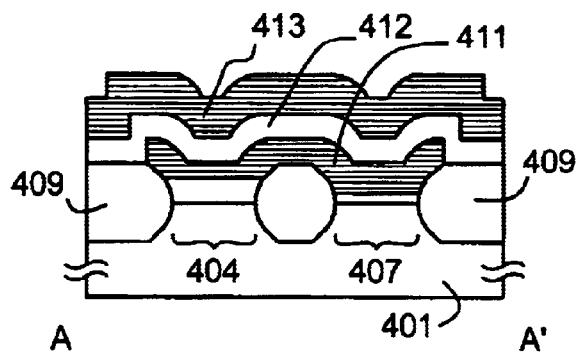
FIG. 4B is a sectional view along a line A–A' shown in FIG. 4A.
Figure 4C:
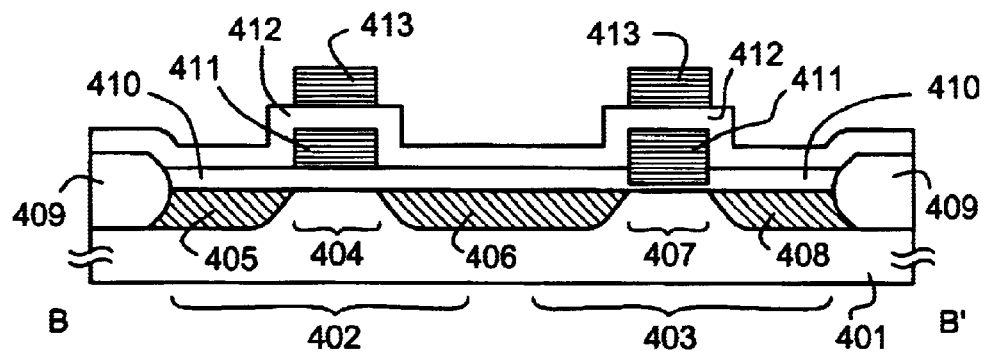
FIG. 4C is a sectional view along a line B–B' shown in FIG. 4A.
Figure 4D:
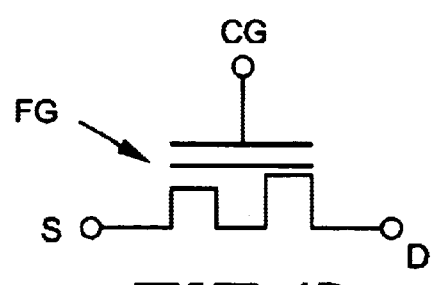
FIG. 4D shows an NN type of memory transistor by circuit marks.

Next, an NN type memory cell in which writing is self-concluded will be described as an example of a memory cell (a memory transistor) in the second embodiment mode of the invention. FIG. 4A is a plan view of a memory cell in this mode. FIG. 4B is a sectional view along a line A–A' shown in FIG. 4A. FIG. 4C is a sectional view along a line B–B' shown in FIG. 4A. FIG. 4D shows a circuit mark. A memory cell comprising two N type memory transistors is called herein an NN type memory cell. Similarly, a memory cell comprising two P type memory transistors is called herein a PP type memory cell.

In FIGS. 4A, 4B and 4C, a memory cell comprising a writing control memory transistor 402 and a writing memory transistor 403 is formed on a single crystal substrate 401. The writing control memory transistor 402 comprises a channel region 404, a source region 405 and a source/drain region 406. The writing memory transistor 403 comprises a channel region 407, a source/drain region 406 and a drain region 408. The channel regions 404 and 407, the source region 405, the source/drain region 406 and the drain region 408 are collectively called an active layer. The active layer is surrounded by an element separation region 409 formed on the single crystal substrate 401. The source region 405, the source/drain region 406 and the drain region 408 are N types impurity region and formed by adding arsenic or phosphorus to the single crystal substrate 401.

A first insulating film (a tunnel oxide film) 410 is piled on the channel region 404 of the writing control memory transistor 402 and the channel region 407 of the writing memory transistor 403. The tunnel oxide film 410 is provided thereon with an electric charge accumulation layer (a floating gate) 411 so that the electric charge accumulation layer would overlap the channel region 404 of the writing control memory transistor 402 and the channel region 407 of the writing memory transistor 403. A second insulating film 412 is piled on the floating gate 411. The second insulating film 412 is provided thereon with a control gate 413.

A memory cell in this mode comprises two memory transistors in which the floating gate 411 is inserted between the channel region 404 and the control gate 413 and between the channel region 407 and the control gate 413 as well as in a conventional floating gate type memory transistor, as shown in FIGS. 4A through 4D. The tunnel oxide film 410 in the writing memory transistor 403 is formed thinner than the tunnel oxide film 410 in the writing control memory transistor 402. Accordingly, charge injection is substantially carried out only in the writing memory transistor 403 in a writing operation.

There is a difference provided in threshold voltage between the writing control memory transistor 402 and the writing memory transistor 403 due to a difference in film thickness of the tunnel oxide film and a difference in concentration of an impurity added to the channel region 404 and the channel region 407. The threshold voltage of a memory transistor in a condition that no electric charge is accumulated in the floating gate 411 is Vthc0 in the writing control memory transistor 402 and Vtht0 in the writing memory transistor 403. In this mode, Vthc0 is set to be 5 V and Vtht0 is set to be 0 V as an example. Generally, the values may be Vthc0>Vtht0.

Next, a writing operation, a reading-out operation and an erasing operation of a memory transistor in this mode will be described. In the description of this mode, the writing and erasing operations are carried out by means of a tunnel current. The storing condition of a memory transistor after writing is set to be "1" and the threshold voltage in the writing memory transistor 403 is set to be 4.8 V to 5.2 V. The condition that no electric charge is accumulated in the floating gate or the condition after erasing is set to be "0" and the threshold voltage in the writing memory transistor 403 is set to be −3 V to 0 V. Description will be carried out hereinafter with reference to a circuit mark shown in FIG. 4D. An example of an operation voltage in the writing operation, the reading-out operation and the erasing operation (control gate potential VCG, drain potential VD and source potential VS) is shown in Table 2. Table 2 shows, of course, only an example of an operation voltage, which is not limited to the values shown in Table 2. A condition of a memory transistor before writing is set to be "0".

Table 2

In order to carry out the writing operation, proper negative potential VS (−10 V, in this case) is applied to the source region 405 (the terminal S) of the writing control memory transistor 402, while proper potential VCG (0 V, in this case) is applied to the control gate 413 (the terminal CG). The drain region 408 (the terminal D) of the writing memory transistor 403 is in a floating condition.

When the above potential is applied, the writing control memory transistor 402 turns on and an electric charge is injected from the source/drain region 406 to the floating gate 411 through the tunnel oxide film 410 of the writing memory transistor 403. The threshold voltages in the writing control memory transistor 402 and the writing memory transistor 403 rise up gradually by injection of the electric charge. A channel of the writing control memory transistor 402 is closed (turns off) at the moment when the threshold voltage Vthc in the writing control memory transistor 402 becomes equal to the VCG−VS (10 V, in this mode). At that time, there is a difference in potential between the source region 405 and the floating gate 411, but the tunnel current does not flow. On the other hand, there is little difference in potential between the source/drain region 406 and the floating gate 411 and the tunnel current does not flow. Thus, no electric charge is injected to the floating gate 411. Writing is self-concluded accordingly. The threshold voltage Vtht in the writing memory transistor 403 after writing is expressed by Vtht=Vtht0−Vthc0+VCG−VS, which is 5 V in this mode.

As described above, in a memory cell in the second mode in this specification, a threshold voltage in writing can be controlled so that the writing would be self-concluded. Dispersion width of the threshold voltage after writing does not depend on a difference in writing speed in each memory transistor. The dispersion width of the threshold voltage after writing is as narrow as that of a difference between a threshold of the writing control region and a threshold of the writing region. The writing operation can be accordingly performed without checking by the reading-out operation, so that a memory transistor would be superior to verify-writing in consumption power and writing time.

The terminal S is connected to the GND while 7 V is applied to the terminal CG when the reading-out operation is carried out. Further, small positive potential (1 V, in this case) is applied to the terminal D. In the case that a memory transistor is "0" here, the memory transistor turns on and an electric current flows between the source and the drain. On the other hand, in the case that a memory transistor is "1". The memory transistor turns off and no electric current flows between the source and the drain. Thus, storing information in the memory transistor can be read out by means of the electric current flowing between the source and the drain.

The terminal S is made to be in an electrically floating condition while the terminal D is connected to the GND when the erasing operation is carried out. Applying negative high potential (−15 V, in this case) to the terminal CG causes a tunnel current to flow between the floating gate 311 and the drain region 408, so that the electric charge would be drawn.

The operation voltage described above is only an example and the values are not limited to the above.

In the case that the structure described in this mode is made in accordance with a same design rule as the first embodiment mode, the size of the structure in this mode is larger than that of the first embodiment mode, and thereby, the structure in this mode has a disadvantage in view of the integration density. In the structure in this mode, however, dispersion among elements can be reduced since the channel length can be easily controlled, for example.

A method for writing is not limited to a tunnel current method but may be a hot electron injection method, as shown in the first mode.

It is possible to use a PP type memory cell in which erasing is self-concluded although an NN type of memory cell in which writing is self-concluded is described in this mode. In the former case, the memory cell comprises an erasing memory transistor and an erasing control memory transistor so that a threshold voltage in the erasing memory transistor would be higher than that of the erasing control memory transistor. Further, the thickness of a tunnel oxide film in the erasing memory transistor is made thinner than the thickness of a tunnel oxide film in the erasing control memory transistor.

A PP type memory transistor in which an erasing operation is carried out by using a tunnel current and is self-concluded will be described. Hereinafter, the description is provided by replacing the writing control region 402 and the wiring region 403 shown in FIGS. 4A through 4D with an erasing control region and an erasing region, respectively. Note that the threshold voltage in a condition before erasing is Vthc0 in the erasing control region and Vtht0 in the erasing region. In this embodiment mode the Vthc0 is 1V and Vtht0 is 4V. Generally, the values may be Vthc0<Vtht0.

A PP type memory transistor in which an erasing operation is carried out by using a tunnel current and is self-concluded will be described. The drain region is made to be in an electrically floating condition while the source region is connected to the GND. Applying negative potential VCG (−5V, in this case) to the control gate causes a tunnel current to flow from the floating gate to the source region, so that the electric charge would be drawn. A channel in the erasing control region is closed at the moment when the threshold voltage Vthc of the erasing control region becomes equal to the VCG (−5V in this case). Then, the electric current does not flow between the source and the drain of memory transistor, so that no electric charge is drawn from the floating gate. Erasing is self-concluded accordingly. The threshold voltage Vtht of the erasing region after erasing is expressed by Vtht=Vtht0−Vthc0+VCG−VS, which is −2V in this embodiment mode.

Thus, according to the structure shown in this mode, writing, or erasing at a high speed with low consumption power can be performed and self-concluded so as to obtain a memory cell in which controlling of a threshold voltage after writing or erasing is superior.

DESCRIPTION OF THE PREFERRED EMBODIMENT

[Embodiment 1]

A method of manufacturing an N type memory transistor, which has a structure described in the paragraphs of the first mode and in which writing is self-concluded, will be described in this embodiment.

FIGS. 5A to 5E and FIGS. 6A to 6E are respectively sectional views of an N type memory transistor, in which writing is self-concluded, in the above first mode for in respective manufacturing processes. The sectional views are along a line B–B' shown in FIG. 1A. In FIGS. 5A to 5E and FIGS. 6A to 6E, a common portion is marked with a common reference numeral.

Figure 5A:
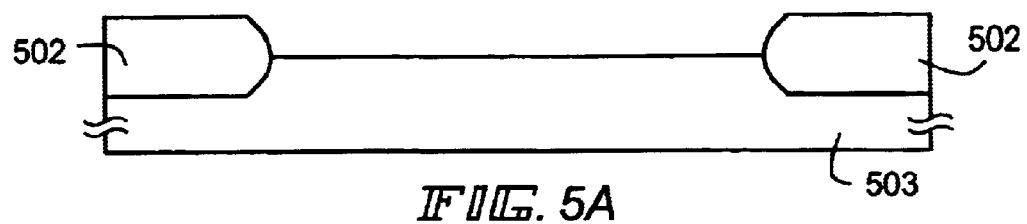
FIGS. 5A through 5E are sectional views of an N type memory transistor in Embodiment 1 in a main manufacturing process.

First, an element separation region 502 is formed on a single crystal substrate 501 by a LOCOS method as shown in FIG. 5A. The element separation region 502 may be a trench embedded area or an area formed by another well-known method. The single crystal substrate 501 may be replaced with a semiconductor thin film formed on a substrate having an insulating surface or an SOI substrate. In these cases, the element separation region is formed at the same time as patterning of an active layer in an etching step.

Figure 5B:
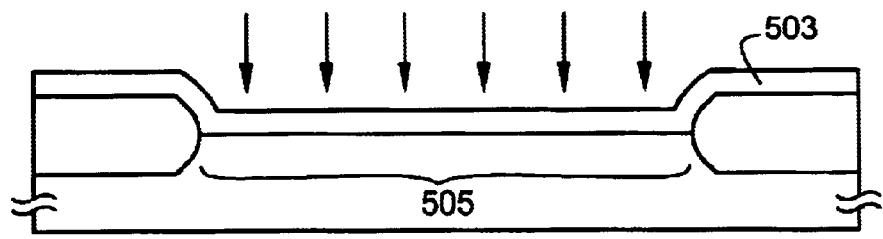

Then, a silicon dioxide film is formed in 500 Å in thickness as a sacrifice oxide film 503 by means of a CVD apparatus, as shown in FIG. 5B. First channel doping is here carried out in order to shift a threshold value of the memory transistor to the side of normally-off. In the first channel doping, a P type impurity element (boron, in this embodiment) is added to an active layer 504. The concentration of boron can be controlled so as to be $1\times10^{17}$ atom/cm$^3$ to $1\times10^{19}$ atom/cm$^3$ in accordance with a design value of a threshold voltage in a writing region 505.

Figure 5C:
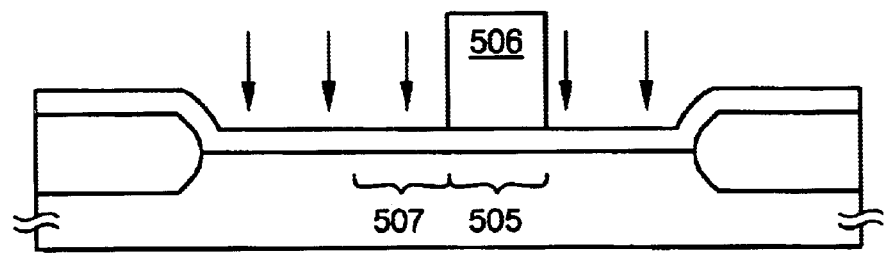

Then, a photo resist 506 corresponding to a pattern of the writing region 505 is provided as a mask to carry out second channel doping, as shown in FIG. 5C. In the second channel doping, a P type impurity element (boron, in this embodiment) is added to the active layer 504. The concentration of boron can be controlled so as to be $1\times10^{17}$ atom/cm$^3$ to $1\times10^{19}$ atom/cm$^3$ in accordance with a design value of a threshold voltage in a writing control region 507.

Changing the concentration of an added impurity element can cause a difference in threshold voltage between the writing region 505 and a writing control region 507. It is also possible to make the difference in threshold voltage by changing thickness of a tunnel oxide film on the writing region 505 and on the writing control region 507 in a later-mentioned step of forming a tunnel oxide film. In this embodiment, channel doping capable of precisely controlling the difference in threshold voltage is carried out so as to provide a difference in threshold voltage.

After the step of adding an impurity element is completed as described above, activation of the impurity element is carried out in any step of furnace annealing, laser annealing and lamp annealing or in a step in which the above steps are combined. Damage of the activation layer undergone in the adding step is simultaneously repaired. A heat treatment is carried out in a nitrogen atmosphere at 800 C. for 1 hour in this embodiment. The sacrifice oxide film 503 is eliminated after the heat activation.

Figure 5D:
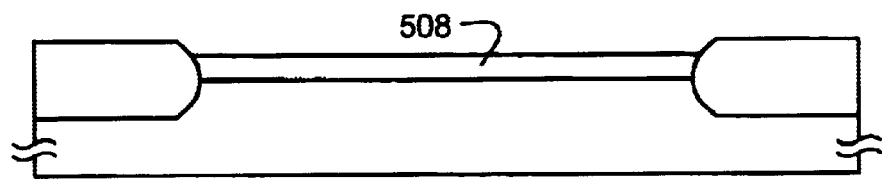

A tunnel oxide film 508 is then formed in an oxygen atmosphere in a first heat oxidation step, as shown in FIG. 5D. The tunnel oxide film 508 is formed into the thickness obtained by subtracting the increased amount in the thickness of a tunnel oxide film in a later-mentioned second heat oxidation step from a design value of the thickness of a tunnel oxide film in the writing control region. The tunnel oxide film is formed into 300 Å in thickness in this embodiment.

Figure 5E:
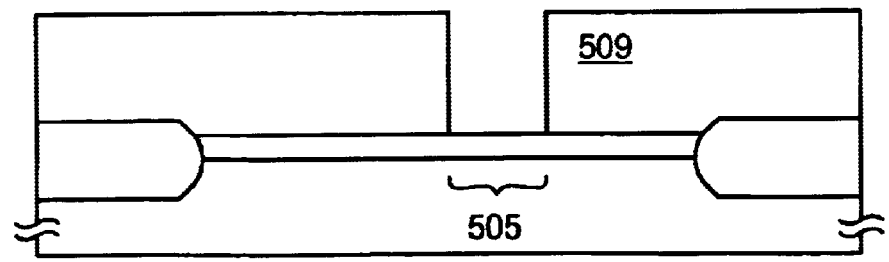
Figure 6A:
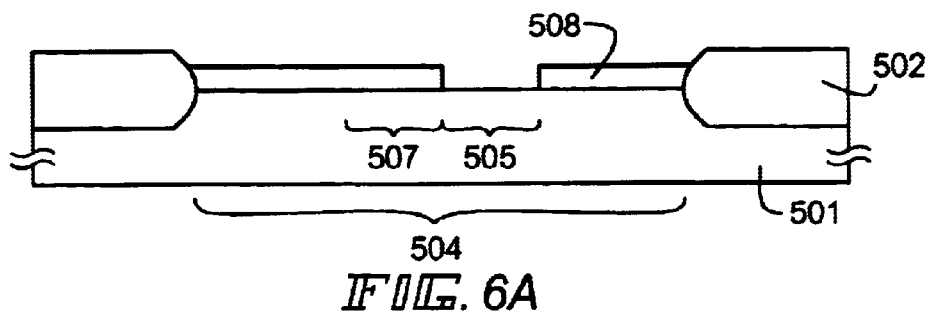
FIGS. 6A through 6E are sectional views of an N type memory transistor in Embodiment 1 in a main manufacturing process.

A photo resist 509 corresponding to a pattern of the writing region 505 is then formed, as shown in FIG. 5E. The photo resist 509 is used as a mask to eliminate the tunnel oxide film 508 on the writing region 505 so that a memory transistor would be formed as shown in FIG. 6A.

Figure 6B:
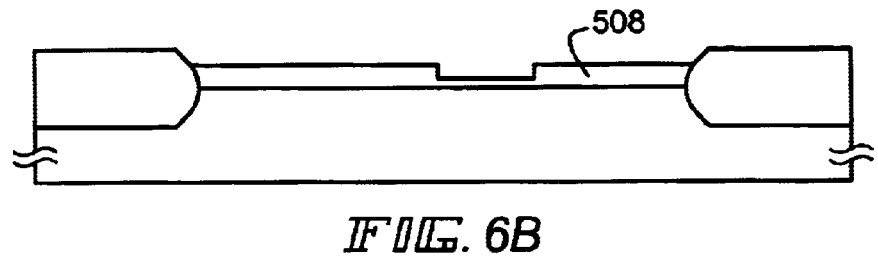

Following to the above, a second heat oxidation step is carried out again in an oxygen atmosphere to form the tunnel oxide film 508, as shown in FIG. 6B. The thickness of an oxide film on the writing region is here formed into a design value. The thickness is 100 Å in this embodiment. The thickness of a tunnel oxide film in a region other than the writing region increases less than the increased amount in the thickness on the oxide film in the writing region, although the former also increases in the above heat oxidation step. The thickness of a tunnel oxide film has a relation with an applied voltage in a writing operation in a memory transistor according to the invention. A person who carries out the invention may appropriately determine the thickness of the tunnel oxide film in accordance with specifications.

Figure 6C:
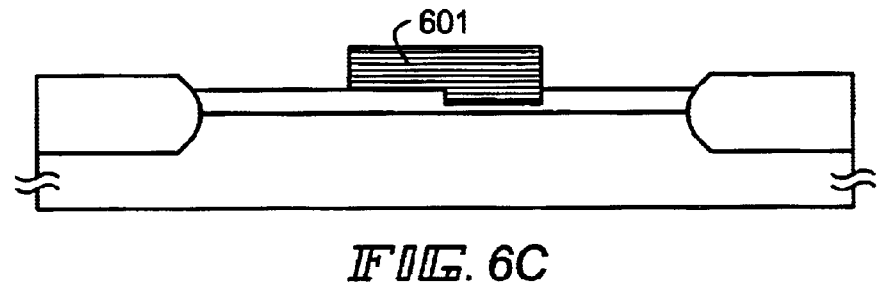

Next, a conductive thin film is formed so as to form a photo resist corresponding to a forming pattern of a floating gate 601, though it is not shown in the drawings. The photo resist is used as a mask to carry out anisotropy etching of a conductive thin film by means of an RIE apparatus or an ICP apparatus, and thereby, the floating gate 601 is formed as shown in FIG. 6C. The conductive thin film here may be a conductive multi-crystal silicon thin film, a tungsten thin film, an aluminum thin film, or a metal thin film based on aluminum, or a film having a piled structure thereof. A tungsten thin film is used in this embodiment.

Figure 6D:
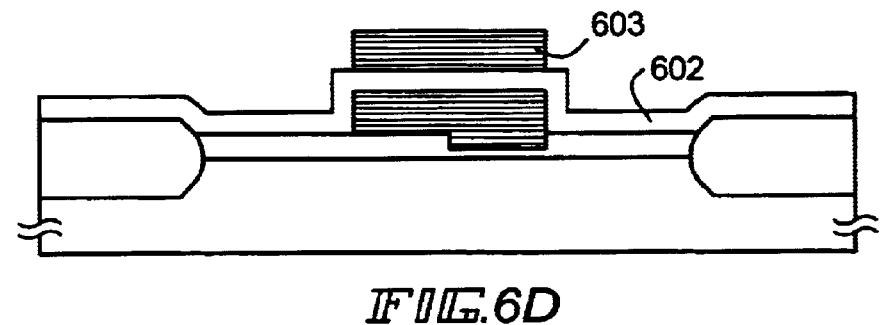

Then, a second insulating film 602 is formed as shown in FIG. 6D. The second insulating film 602 may be a thin film of silicon dioxide or a piled layer film, which is usually called an ONO film and in which silicon dioxide, silicon nitride and silicon dioxide are piled in order. A thin film of silicon dioxide is formed into 500 Å in this embodiment.

Following to the above, a conductive thin film is formed, a photo resist corresponding to a pattern of a control gate 603 is formed, and then, the conductive thin film is etched with the photo resist used as a mask, in order, to form the control gate 603 as shown in FIG. 6D. The conductive thin film here may be a conductive multi-crystal silicon thin film, a tungsten thin film, an aluminum thin film, or a metal thin film based on aluminum, or a film having a piled structure thereof. A tungsten thin film is used in this embodiment.

Figure 6E:
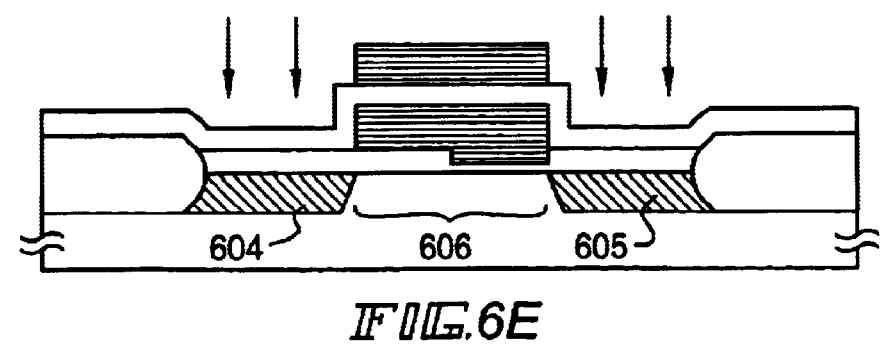

Then, an N type impurity element is added, using the floating gate 601 and the control gate 603 as a mask, to form a source region 604 and a drain region 605 as shown in FIG. 6E. In this embodiment, phosphorus is added to the active layer 504 as the N type impurity element. The concentration of phosphorus can be controlled to be $1 \times 10^{20}$ atom/cm$^3$ to $1 \times 10^{22}$ atom/cm$^3$. A channel region 606 is a region other than the source region 604 and the drain region 605 in the active layer 504.

Impurity injection to the drain region 605 may be carried out with a higher energy than impurity injection to the source region 604 as well as the depth of junction in the drain region 605 may be deeper than the depth of junction in the source region 604, and thereby, an overlap region may be formed between the drain region 605 and the floating gate 601.

The N type memory transistor of the first embodiment of the invention can be completed by forming an interlayer film, a contact hall and a metal wiring layer in accordance with a well-known manufacturing method following to the above, although it is not especially shown in the drawings.

A method of manufacturing an N type memory transistor in which writing is self-concluded is described in this embodiment. The same method can also be used for manufacturing a P type memory transistor in which erasing is self-concluded. In the case of manufacturing a P type of memory transistor, a P type impurity element can be added to an active layer to form a source region and a drain region.

The manufacturing method described in this embodiment can be similarly applied to an NN type memory cell, which is described in the second embodiment mode and in which writing is self-concluded. It can be further applied to a PP type memory cell in which erasing is self-concluded.

According to the structure described in this embodiment, writing or erasing can be carried out and self-concluded at a high speed with low consumption power, as described above. Therefore, it is possible to manufacture a memory transistor or a memory cell superior in control of a threshold voltage after writing or erasing.

[Embodiment 2]

A writing operation, a reading-out operation and an erasing operation in the case that the N type memory transistor described in the first mode is used as a memory transistor in which multi-value information comprising three or more values is stored will be described in this embodiment. Writing is carried out by the hot electron injection method while erasing is carried out by the tunnel current method, and the case of storing four value information is described in this embodiment.

Description will be carried out hereinafter with reference to a circuit mark shown in FIG. 1. The threshold voltage in a condition that no electric charge is accumulated in the floating gate 109 is Vthc0 in the writing control region 106 and Vtht0 in the writing region 107. In this embodiment, Vthc0 is 4 V and Vtht0 is 0 V hereinafter. Generally, the values may be Vtch0>Vtht0. The storing condition of a memory transistor that no electric charge is accumulated in the floating gate or the storing condition of a memory transistor after erasing is set to be "0" (hereinafter, the storing condition "0") and the threshold voltage in the writing region is set to be −3 V to 0 V. The storing condition of a memory transistor after writing is set to be "1", "2" and "3" (hereinafter, the storing condition "1", "2" and "3") and the respective threshold voltages in the writing region are set to be 5.8 V to 6.2 V. 6.8 V to 7.2 V and 7.8 V to 8.2 V.

An example of an operation voltage in the writing operation, the erasing operation and the reading-out operation (control gate potential VCG, drain potential VD and source potential VS) is shown in Table 3. Table 3 shows only an example of an operation voltage, of course, which is not limited to the values shown in Table 3. A condition of a memory transistor before writing is set to be "0".

Table 3

In order to carry out the writing operation, the source region 103 (a terminal S) is first connected to the GND. Positive potential VD (8 V, in this embodiment) is applied to the drain region 104 (a terminal D). Positive potential VCG is applied to the control gate 111 (CG) in accordance with a storing condition. The VCG is set to 10 V, 11 V and 12 V respectively in order to make the storing conditions "1", "2" and "3" in this embodiment.

When the above potential is applied, a hot electron generated in the vicinity of the drain region 104 is injected to the floating gate 109, so that the threshold voltages in the writing control region 106 and the writing region 107 gradually rise up. A channel of the writing control region 106 is closed at the moment when the threshold voltage Vthc of the writing control region 106 becomes equal to the VCG. Then, the electric current does not flow between the source 103 and the drain 104 of a memory transistor, so that no hot electron would be generated in the vicinity of the drain region 104. Thus, no electric charge is injected to the floating gate 109. Writing is self-concluded accordingly. The threshold voltage Vtht of the writing region 107 after writing is expressed by Vtht=Vtht0−Vtch0+VCG, which is 6 V, 7 V and 8 V, respectively in the storing conditions "1", "2" and "3" in this embodiment while the threshold voltage Vthc of the writing control region 106 is 10 V. 11 V and 12 V, respectively.

As described above, in a memory transistor according to the invention, a threshold voltage can be controlled even in writing multi-value information so that the writing would be self-concluded. Dispersion width of the threshold voltage in each condition after writing does not depend on a difference in writing speed in each memory transistor. The dispersion width of the threshold voltage in each condition after writing is as narrow as that of a difference in threshold voltage between the writing control region and the writing region. The writing operation can be performed without checking by the reading-out operation, so that a memory transistor would be superior to verify-writing in consumption power and writing time.

The terminal S is connected to the GND while small positive potential (1 V, in this case) is applied to the terminal D when the reading-out operation is carried out. 10.5 V is here applied to the terminal CG as first reading-out potential.

In the case that an electric current flows between the source and the drain of a memory transistor, the storing condition should be one of "0" and "1" and 5 V is further applied as second reading-out potential following to the above first reading-out potential. In the case that an electric current flows again here between the source and the drain of a memory transistor, the storing condition should be "0", while it should be "1" in the case that an electric current does not flow. The storing condition is any one of "2" and "3" in the case that an electric current does not flow between the source and the drain of a memory transistor when 10.5 V is applied to the terminal CG as the first reading-out potential. In this case, 11.5 V is subsequently applied as third reading-out potential. The storing condition should be "3" in the case that an electric current does not flow again here, while it should be "2" in the case that an electric current flows.

As described above, multi-value storing information in a memory transistor can be read out by judging the flow of an electric current between the source and the drain in accordance with the reading-out potential applied to the terminal CG. The electric current flowing between the source and the drain generates no hot electron since the potential applied to the terminal D is small. Therefore, the potential applied to the terminal CG during the reading-out operation does not cause electric charge injection to the floating gate 109.

In the case of carrying out the erasing operation, the terminal S is electrically in floating condition while the terminal D is connected to the GND. The tunnel current flows from the floating gate 109 to the writing region 107 when negative high potential (−20 V, in this case) is applied to the terminal CG, and thereby, an electric charge is drawn.

The operation voltage described above is only an example and the values are not limited to the above.

An N type memory transistor in which writing is self-concluded is described in this embodiment. This embodiment can also be applied to a P type memory transistor in which erasing is self-concluded. This embodiment can also be applied to an NN type of memory cell or a PP type of memory cell, which is described in the second mode, in the case that the hot electron injection is used as a writing method.

According to the structure described in this embodiment, writing or erasing can be carried out at a high speed with low consumption power, as described above. Therefore, it is possible to manufacture a multi-value memory transistor or a multi-value memory cell superior in control of a threshold voltage after writing or erasing.

[Embodiment 3]

A memory transistor according to the invention can be applied to various well-known circuit structures in which a nonvolatile storing element is used. In this embodiment, it will be described that the invention is applied to an NOR type of flush memory.

Figure 7A:
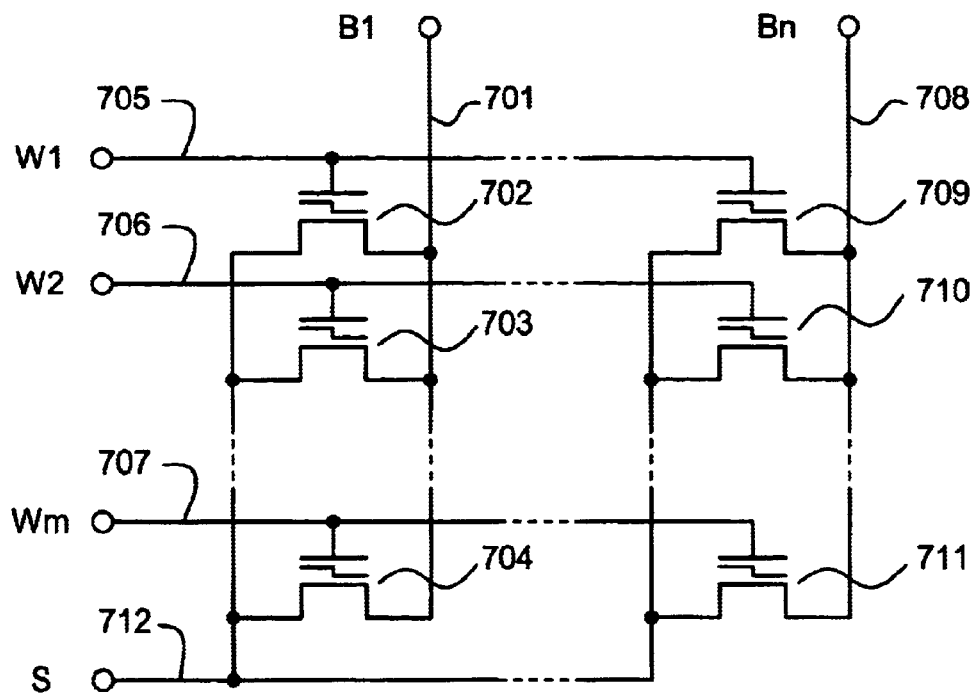
FIG. 7A shows a circuit diagram of an NOR type flash memory in which a memory transistor according to the invention is used.

FIG. 7A is a circuit diagram of an NOR type of flush memory circuit in which a memory transistor is arranged in a shape of matrix comprising m columns and n lines (m and n are respectively integers equal to or more than 1). A memory transistor in this embodiment is an N type memory transistor, which is described in the first mode and in which writing is self-concluded. That is, in each memory transistor, the threshold voltages in the writing region and the writing control region are 0 V and 4 V, respectively, when no electric charge is accumulated in the floating gate.

In FIG. 7A, a bit line 701 shown by B1 is connected to m memory transistors comprising memory transistors 702 to 704 disposed in a first line. The m memory transistors comprising the memory transistors 702 to 704 use m word lines comprising a word lines 705 to 707 respectively shown by W1 to Wm as a control gate. Similarly, a bit line 708 shown by Bn is connected to m memory transistors comprising memory transistors 709 to 711 disposed in an $n^{th}$ line. The m memory transistors comprising the memory transistors 709 to 711 use m word lines 705 to 707 respectively as a control gate. In the memory transistors 702 to 704 and 709 to 711, terminals thereof, which is not connected to the bit line 701 or 708, are connected to a source line 712 (a terminal S).

Figure 7B:
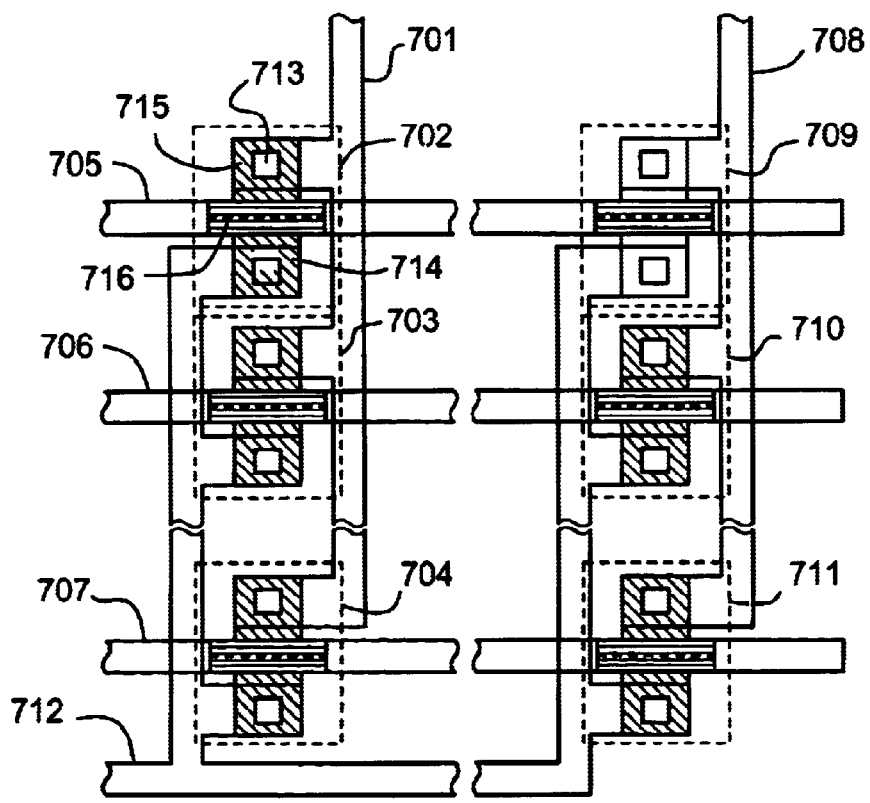
FIG. 7B shows a circuit pattern of FIG. 7A.

FIG. 7B shows an example of a top view of a memory transistor forming an NOR type of flush memory circuit shown in FIG. 7A. In FIG. 7B, a portion corresponding to that of FIG. 7A is marked with a same reference numeral.

In FIG. 7B, a source region 714 and a drain region 715 are electrically connected through a contact hall 713 to a source line 712 and a bit line 701 or 708, respectively, 716 denotes a floating gate.

An operation of an NOR type of flush memory circuit comprising a memory transistor according to the invention as mentioned above will be now described. Writing is carried out by means of a hot electron, while erasing is carried out by means of the tunnel current flowing between the floating gate and the drain region. In the description, writing is carried out per a bit while erasing is carried out in the block.

In this embodiment, a condition of "1" means a condition after writing is performed in a memory transistor, and the threshold voltage of the writing region is 5.8 V to 6.2 V. On the other hand, a condition of "0" means a condition in which no electric charge is accumulated in the floating gate in a memory transistor or a condition after erasing is performed, and the threshold voltage is −3 V to 0 V.

First, the case in FIGS. 7A and 7B that "1" is written in a memory transistor 702 in writing per a bit will be described as a concrete example.

The source line 712 is connected to the GND, 8 V is applied to the bit line 701 and 10 V is applied to the word line 705. (n−1) bit lines and (m−1) word lines other than the above are connected to the GND.

As a result, a hot electron is generated in the vicinity of the drain region of the memory transistor 702 and an electric charge is injected to the floating gate due to an electric field between the floating gate and the active layer, so that "1" would be written. No electric charge is injected to (m×n−1) memory transistors other than the above.

In the case of carrying out erasing in the block, the source line 712 is made to be in a electrically floating condition. Then, m word lines comprising the m word lines 705 to 707 are connected to −20 V, while n bit lines comprising the bit lines 701 and 708 are connected to the GND. As a result, the tunnel current flows, for example, from the floating gate 716 to the drain region 615 in all of the m×n memory transistors, so that the condition would be "0".

Next, a reading-out operation will be described with a concrete example of a method of reading out information in the memory transistor 702 shown in FIGS. 7A and 7B. The source line 712 is first connected to the GND. Then, (m−1) word lines other than the word line 705 are also connected to the GND, and thereby, n×(m−1) memory transistors comprising the memory transistors 703, 704, 710 and 711 other than n memory transistors comprising the memory transistors 702 and 709, which is connected to the word line 705, turn off. 5 V is applied to the word line 705 under the above condition so as to apply small positive potential (1 V, for example) to the bit line 701. The memory transistor 702 turns off when the condition thereof is "1", so that no electric current would flow between the source and the drain. The memory transistor 702 turns on, however, when the condition thereof is "0", so that an electric current would flow between the source and the drain. Information in the memory transistor 702 can be thus read out by detecting an electric current between the source and the drain.

An NN type memory cell described in the second mode can be also used as a memory transistor. The circuit structure of this embodiment can be manufactured in the manufacturing processes shown in Embodiment 1. Further, the structure of this embodiment can be combined with a structure of Embodiment 2 to be put into practice.

According to the structure described in this embodiment, writing or erasing can be carried out and self-concluded at a high speed with low consumption power, as described above. Therefore, it is possible to obtain a nonvolatile semiconductor storing apparatus comprising a memory transistor superior in control of a threshold voltage after writing or erasing.

[Embodiment 4]

An example of a memory transistor according to the invention in the case that the memory transistor is applied to a microprocessor integrated on one chip such as a RISC processor and an ASIC processor will be described in this embodiment.

Figure 8:
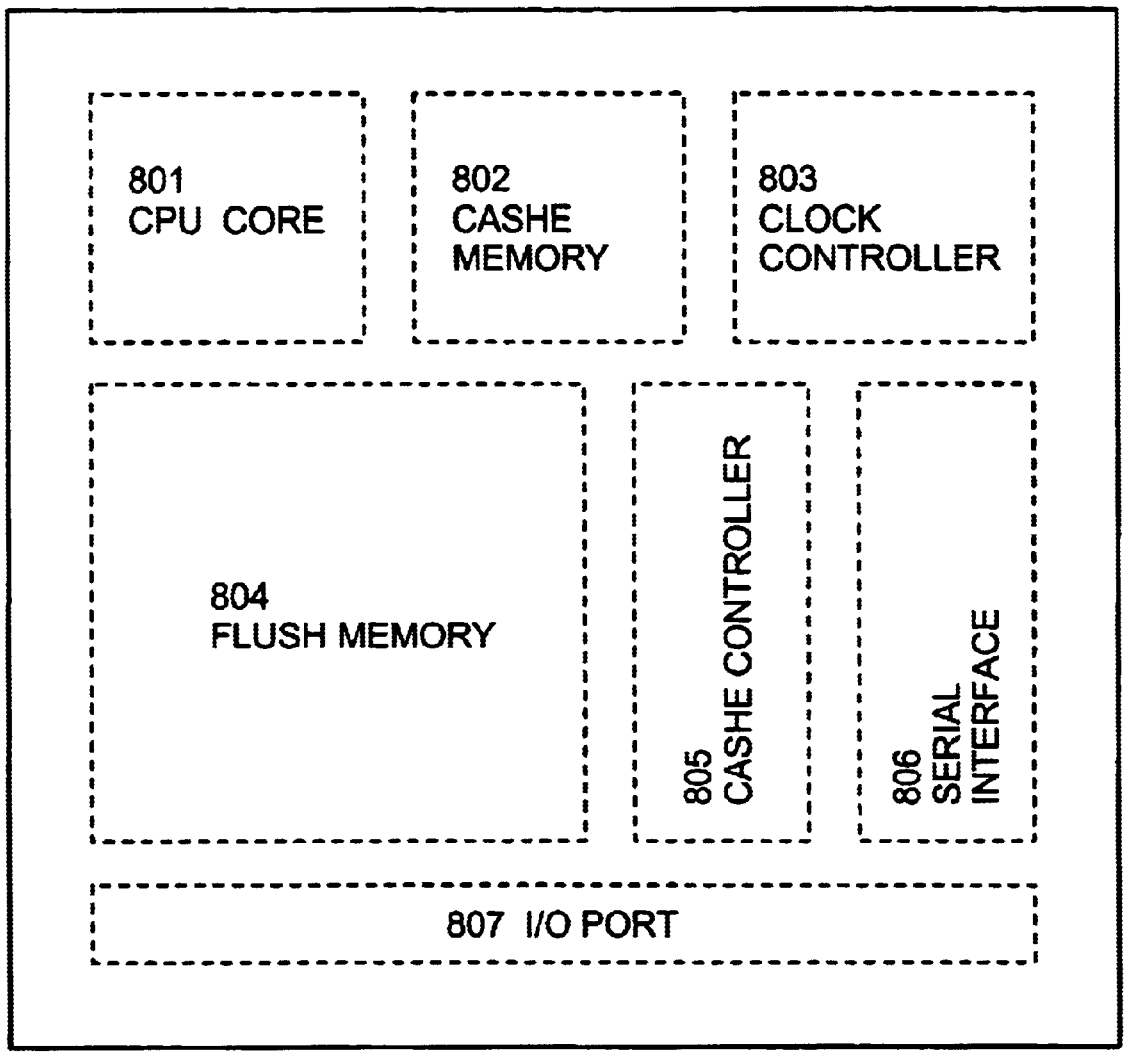
FIG. 8 illustrates a semiconductor circuit using a memory transistor according to the invention.

FIG. 8 illustrates an example of a microprocessor. The microprocessor typically comprises a CPU core, a flush memory, a RAM, a clock controller, a cache memory, a cache controller, a serial interface and an I/O (input/output) port. The microprocessor shown in FIG. 7 is, of course, only a simplified example. A circuit of a microprocessor is variously designed in practice according to the usage thereof.

In the microprocessor shown in FIG. 8, a CPU core 801, a cache memory 802, a clock controller 803, a cache controller 805, a serial interface 806 and an I/O port 807 are provided in a CMOS circuit. A memory transistor according to the invention is used for the flush memory 804. A nonvolatile memory comprising a memory transistor according to the invention may be used for the cache memory 802. The flush memory 804 and the cache memory 802 may be combined with any of structures in the first and second modes for carrying out the invention. A structure in this embodiment can be freely combined with any of structures in the Embodiments 1 to 3 to be put into practice.

According to the structure described in this embodiment, writing or erasing can be carried out and self-concluded at a high speed with low consumption power, as described above. Therefore, it is possible to obtain a microprocessor comprising a memory transistor superior in control of a threshold voltage after writing or erasing.

[Embodiment 5]

A memory transistor according to the invention can be formed into one body with a component of a semiconductor apparatus comprising a TFT formed on a substrate having an insulating surface, so that a multifunctional, sophisticated and small-sized semiconductor apparatus can be provided. As an example of the above, an electro-optical apparatus (typically a liquid crystal display apparatus and a light emitting apparatus) comprising a nonvolatile memory comprising a memory transistor according to the invention, a pixel portion, a drive circuit of the pixel portion and a γ (gamma) compensation circuit will be described in this embodiment.

The γ compensation circuit is a circuit for performing γ compensation. The γ compensation is compensation for creating a linear relation between a voltage applied to a pixel electrode and intensity of a transmission light of a liquid crystal or luminescent layer on the pixel electrode by applying a proper voltage to an image signal.

Figure 9:
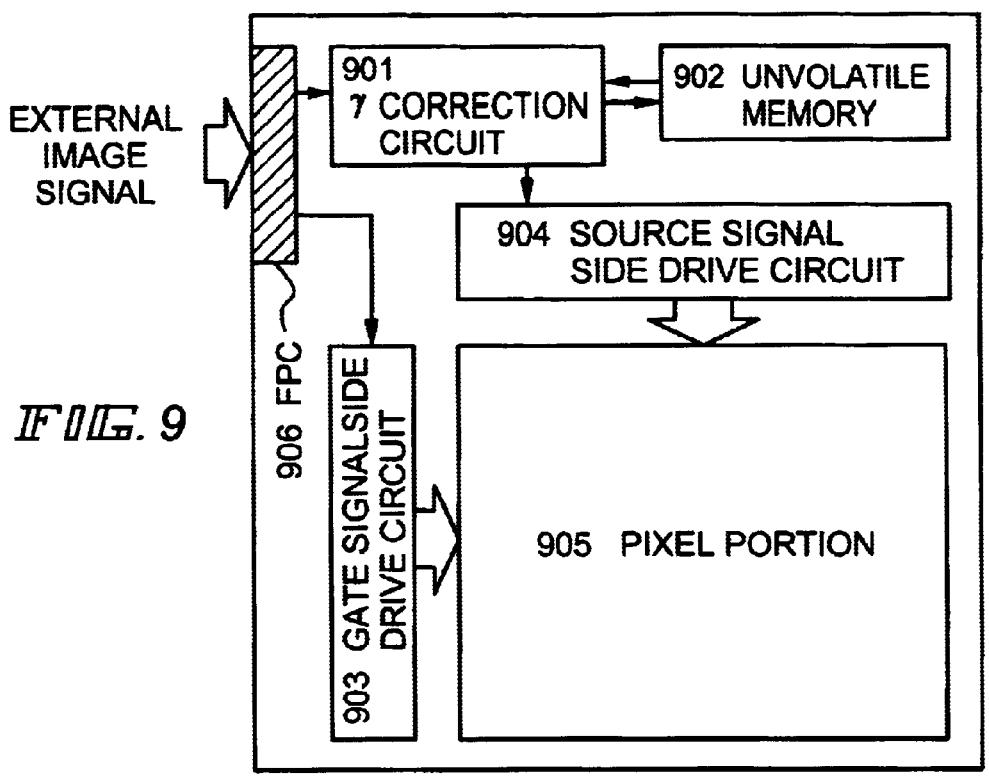
FIG. 9 illustrates an electro-optical apparatus using a memory transistor according to the invention.

FIG. 9 illustrates a block diagram of the above electro-optical apparatus in which a nonvolatile memory 902 comprising a memory transistor according to the invention, a pixel portion 905, a gate signal side drive circuit 903 and a source signal side drive circuit 904, which are drive circuits in the pixel portion, and a γ (gamma) compensation circuit 901 are provided. An image signal, a clock signal or a synchronizing signal is sent through an FPC (flexible printed circuit) 906. Circuit structures described in Embodiments 3 and 4 can be used for a nonvolatile memory 902.

The electro-optical apparatus according to the invention can be formed into one body on a substrate having an insulating surface by the manufacturing method described in Embodiment 1, for example. A well-known method can be used for steps after a step of forming a TFT, including a step of forming a liquid crystal and an EL layer.

Well-known circuit structures can be used for the pixel portion 905, the drive circuits in the pixel portion 903 and 904 and the γ (gamma) compensation circuit 901.

In the electro-optical apparatus according to the invention, the nonvolatile memory 902 stores compensation data for carrying out γ compensation for an image signal sent from a body of a personal computer or a TV receiving antenna. The γ compensation circuit 901 refers to the compensation data to carry out γ compensation for the image signal.

The data for γ compensation can be rewritten regularly although it may be stored once before shipping an electro-optical apparatus. An optical response characteristic of a liquid crystal (such as the above-mentioned relation between the intensity of a transmission light and an applied voltage) is sometimes subtly different even in an electro-optical apparatus manufactured similarly. It is also possible in this case to constantly obtain the same image quality since the γ compensation data different in every electro-optical apparatus can be stored in this embodiment.

Furthermore, it is also possible to freely select a plurality of colors based on the compensation data by storing a plurality of compensation data in the nonvolatile memory and adding a new control circuit.

It is preferable in storing the compensation data of the γ compensation in the nonvolatile memory 902 to use a device described in the Japanese Patent Application No. 156696/1998 filed by the present applicant. The γ compensation is also described in the above application.

It is desirable to form a D/A converter or an A/D converter and the nonvolatile memory on a same substrate in accordance with necessity since the compensation data stored in the nonvolatile memory is a digital signal.

The structure in this embodiment can be freely combined with any of Embodiments 1 to 3 to be put into practice.

Applying a memory transistor according to the invention in which writing or erasing can be self-concluded enables a semiconductor device capable of writing or erasing at a high speed with low consumption power to be obtained.

[Embodiment 6]

An example of a semiconductor device, which is provided with a nonvolatile memory comprising a memory transistor according to the invention and which is different from that of Embodiment 5, will be described with reference to FIG. 10.

Figure 10:
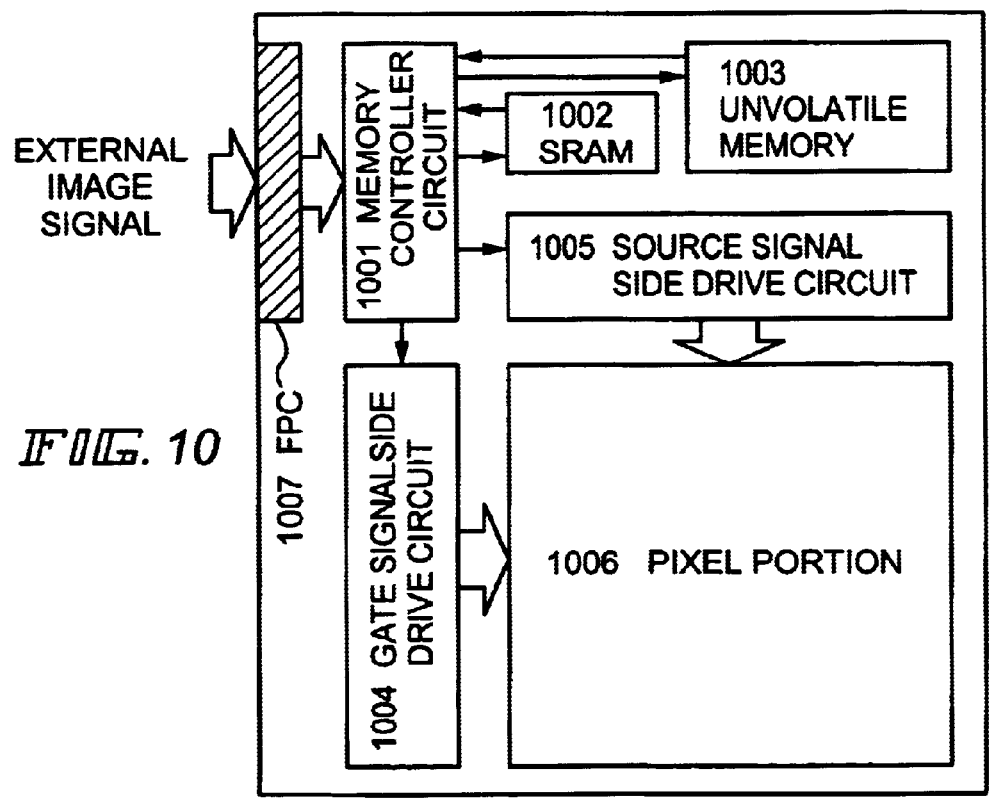
FIG. 10 illustrates an electro-optical apparatus using a memory transistor according to the invention.

FIG. 10 illustrates a block diagram of an electro-optical apparatus (typically, a liquid crystal display apparatus and a light emitting apparatus) of this embodiment. The electro-optical apparatus in this embodiment is provided with a nonvolatile memory 1003 comprising a memory transistor according to the invention, a SRAM 1002, a pixel portion 1006, a gate signal side drive circuit 1004 and source signal side drive circuit 1005, which are drive circuits in the pixel portion, and a memory controller circuit 1001. An image signal, a clock signal or a synchronizing signal is sent through an FPC (flexible printed circuit) 1007.

The memory controller circuit 1001 in this embodiment is a control circuit for controlling an operation of storing and reading out image data in and from the SRAM 1002 and the nonvolatile memory 1003.

The SRAM 1002 is provided to carry out data writing at a high speed. A DRAM may be provided instead of the SRAM, and further, it is not necessary to provide the SRAM in the case that the nonvolatile memory is capable of writing at a high speed.

The electro-optical apparatus of this embodiment can be formed into one body on a substrate having an insulating surface by the manufacturing method described in Embodiment 1, for example. A well-known method can be used for steps after a step of forming a TFT, including a step of forming a liquid crystal and a luminescent layer.

A plurality of the source line side drive circuit and the gate line side drive circuit may be provided as a drive circuit of the pixel portion although only one of each is provided in this embodiment. Well-known circuit structures can be used for the SRAM 1002, the pixel portion 1006, the drive circuits in the pixel portion 1004 and 1005 and the memory controller circuit 1001.

In the electro-optical apparatus in this embodiment, an image signal sent from a body of a personal computer or a TV receiving antenna is stored in the SRAM 1002 by every one frame and is inputted one by one into the pixel portion 1006 through the memory controller circuit 1001 to be displayed. Image information for at least one frame of an image displayed on the pixel portion 1006 is stored in the SRAM 1002. When a 6 bit digital signal is sent as an image signal, for example, a memory capacity equal to at least the number of the pixels×6 bits is required. The memory controller circuit 1001 enables the image signal stored in the SRAM 1002 to be stored in the nonvolatile memory 1003, and the image signal stored in the nonvolatile memory 1003 to be inputted into the pixel portion 1006 to be displayed, in accordance with necessity.

It is desirable to provide a D/A converter or an A/D converter, on a same substrate as provided with the SRAM 1002 and the nonvolatile memory 1003 in accordance with necessity since the image data stored in the SRAM 1002 and in the nonvolatile memory 1003 is a digital signal.

In the structure in this embodiment, an image displayed on the pixel portion 1006 is constantly stored in the SRAM 1002 and the image can be suspended easily. Moreover, an operation such as recording and playback of an image can be easily carried out by storing in the nonvolatile memory 1003 the image signal stored in the SRAM 1002 and by inputting to the pixel portion the image signal stored in the nonvolatile memory 1003. Thus, suspending, recording and playback of television can be freely performed without recording by means of a video deck.

Information amount of the image capable of recording and playback depends on the storing capacity of the SRAM 1002 and the nonvolatile memory 1003. Storing an image signal for at least one frame enables a stationary image to be recorded and played back. When the memory capacity of the nonvolatile memory 1003 can be increased to the degree capable of storing the image information for hundreds or thousands frames, even an image having existed seconds or minutes ago can be replayed.

The structure in this embodiment can be freely combined with any of Embodiments 1 to 5 to be put into practice.

Applying a memory transistor according to the invention in which writing or erasing can be self-concluded enables a semiconductor apparatus capable of writing or erasing at a high speed with low consumption power to be obtained.

[Embodiment 7]

The nonvolatile memory according to the invention can be incorporated in electronic device in various fields as a storing medium for storing and reading out data. Such electronic device will be described in this embodiment.

An electronic device capable of using the nonvolatile memory according to the invention may be a display, a video camera, a digital camera, a head-mount type of display, a DVD player, a game machine, a goggle type of display, a car navigation apparatus, an acoustic playback apparatus (such as a car audio), a personal computer and a portable information terminal (such as a mobile computer, a portable phone and an electronic book). FIGS. 11A through 11F and 12A through 12B illustrate examples of the above.

FIG. 11A illustrates a display comprising a basket body 1001, a supporting stand 1002 and a display portion 1003. The involatile memory comprising a memory transistor of the invention is connected to the display portion 1003 or another signal control circuit to be used for compensating an image signal or storing process data.

FIG. 11B illustrates a video camera comprising a body 1011, a display portion 1012, a sound inputting portion 1013, an operation switch 1014, a battery 1015 and a receiving portion 1016. The invention is incorporated in a built-in LSI substrate to be used for storing image data.

FIG. 11C illustrates a part (only the right side) of a head-mount type of display comprising a body 1021, a signal cable 1022, a head fixing band 1023, a display portion 1024, an optical system 1010 and a display device 1026. The invention is connected to the display device 1026 or another signal control circuit to be used for compensating an image signal or storing process data.

FIG. 11D illustrates an image playback apparatus provided with a storing medium (concretely, a DVD playback apparatus) comprising a body 1031 a storing medium 1032, an operation switch 1033, a display portion (a) 1034 and display portion (b) 1035. In this apparatus, a DVD (digital versatile disc) or a CD is used as a recording medium so as to enjoy appreciation of music or movies, play of games, and Internet. The invention is incorporated in a built-in LSI substrate to be used for storing image data and process data.

FIG. 11E illustrates a goggle type of display comprising a body 1041, a display portion 1042 and an arm portion 1043. The invention is connected to the display portion 1042 or another signal control circuit to be used for compensating an image signal or storing process data.

FIG. 11F illustrates a personal computer comprising a main body 1051, a basket body 1052, a display portion 1053 and a keyboard 1054. The invention is incorporated in a built-in LSI substrate to be used for storing process data and image data.

Figure 12A:
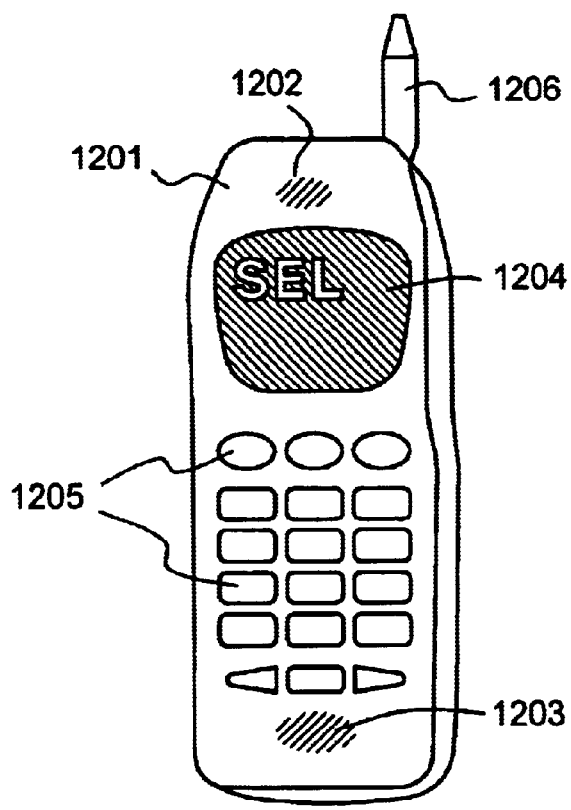
FIGS. 12A and 12B illustrate electronic device using a memory transistor according to the invention.

FIG. 12A illustrates a portable phone comprising a body 1101, a sound outputting portion 1102, a sound inputting portion 1103, a display portion 1104, an operation switch 1105 and an antenna 1106. The invention is incorporated in a built-in LSI substrate to be used for adding an address function for recording a telephone number.

Figure 12B:
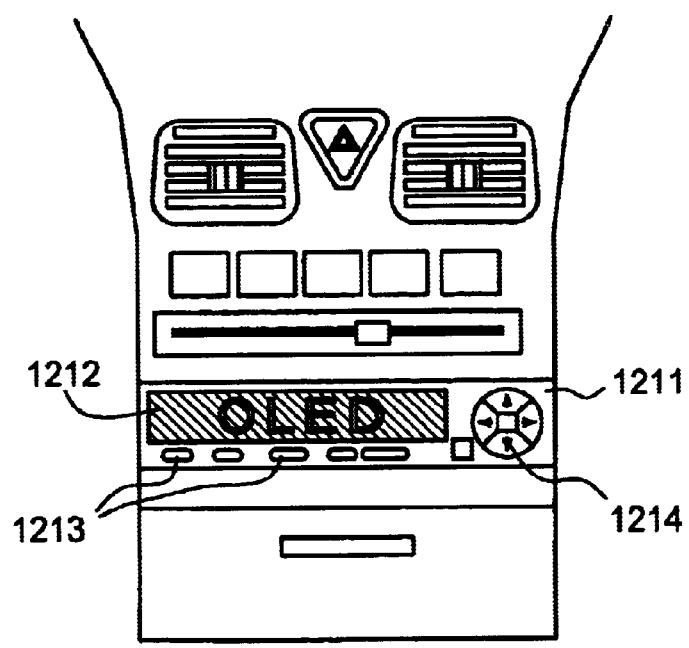

FIG. 12B illustrates an acoustic playback apparatus, concretely a car audio, comprising a body 1111, a display portion 1112 and operation switches 1113 and 1114. The invention is incorporated in a built-in LSI substrate to be used for storing image data and process data. The invention may be used for a portable or domestic acoustic playback apparatus although an audio for an automobile is described in this embodiment.

As described above, an application range of the invention is so wide that the invention can be applied to electronic device in various fields. The electronic device in this embodiment can be provided in a structure of any combination of Embodiments 1 to 6.

Thus, applying a memory transistor according to the invention in which writing or erasing can be self-concluded enables a semiconductor apparatus capable of writing or erasing at a high speed with low consumption power to be obtained.

According to the invention, it is possible to obtain a memory transistor in which dispersion width of a threshold after writing or erasing is very narrow and in which writing or erasing can be carried out at a high speed with low consumption power. Further, applying such memory transistor enables a semiconductor nonvolatile memory capable of writing or erasing at a high speed with low consumption power to be obtained. Moreover, mounting such memory transistor enables electronic device capable of writing or erasing at a high speed with low consumption power to be obtained.

TABLE 1

|  | VCG | VD | VS | mechanism |
|---|---|---|---|---|
| writing | 10 V | 8 V | 0 V | hot electron injection |
| erasing | −20 V | float | 0 V | tunnel current drawing |
| reading-out | 5 V | 1 V | 0 V | — |

TABLE 2

|  | VCG | VD | VS | mechanism |
|---|---|---|---|---|
| writing | 0 V | float | −10 V | tunnel current injection |
| erasing | −15 V | float | 0 V | tunnel current drawing |
| reading-out | 7 V | 1 V | 0 V | — |

TABLE 3

|  | VCG | VD | VS | mechanism |
|---|---|---|---|---|
| writing "1" | 10 V | 8 V | 0 V | hot electron injection |
| writing "2" | 11 V |  |  |  |
| writing "3" | 12 V |  |  |  |
| erasing | −20 V | float | 0 V | tunnel current drawing |
| reading-out "0" | 10.5 V/5 V | 1 V | 0 V | — |
| reading-out "1" | 10.5 V/5 V |  |  |  |
| reading-out "2" | 10.5 V/11.5 V |  |  |  |
| reading-out "3" | 10.5 V/11.5 V |  |  |  |

What is claimed is:

1. A semiconductor device comprising:
    an active layer having a drain region, a source region, and a channel forming region formed over a substrate;
    a first region and a second region formed in the channel forming region;
    a first insulating film formed on the active layer;
    a floating gate formed on the first insulating film;
    a second insulating film formed on the floating gate; and
    a control gate formed on the second insulating film,
    wherein a concentration of impurity elements in the first region is lager than a concentration of impurity elements in the second region;
    wherein a thickness of the first insulating film on the second region is thinner than a thickness of the second insulating film on the first region.

2. A semiconductor device according to claim 1, wherein a threshold of the first region is lager than a threshold of the second region.

3. A semiconductor device according to claim 1, wherein the semiconductor device is an electronic device selected from the group consisting of a video camera, a digital camera, a head-mount type of display, a DVD player, a game machine, a goggle type of display, a car navigation apparatus, an acoustic playback apparatus, a personal computer and a portable information terminal.

4. A semiconductor device comprising:
    an active layer comprising a first channel forming region interposed between a source region and a source/drain region and a second channel forming region interposed between the source/drain region and a drain region formed over a substrate;
    a first insulating film formed on the active layer;
    a first floating gate and a second floating gate formed on the first insulating film;
    a second insulating film formed on the first and the second floating gates;
    a first control gate and a second control gate formed on the second insulating film;
    wherein a concentration of impurity elements in the first channel forming region is lager than a concentration of impurity elements in the second channel forming region; and
    wherein a thickness of the first insulating film on the second channel forming region is thinner a thickness of the first insulating film on the first channel forming region.

5. A semiconductor device according to claim 4, wherein a threshold of the first channel forming region is lager than a threshold of the second channel forming region.

6. A semiconductor device according to claim 4, wherein the semiconductor device is an electronic device selected from the group consisting of a video camera, a digital camera, a head-mount type of display a DVD player, a game machine, a goggle type of display, a car navigation apparatus, an acoustic playback apparatus, a personal computer and a portable information terminal.

7. A microprocessor comprising a CPU core, a cache memory, a flush memory, a clock controller, a cache controller, and a serial interface, an I/O port, at least one of the cache memory and the flush memory comprising:
    an active layer comprising a drain region, a source region, and a channel forming region formed over a substrate;
    a first region and a second region formed in the channel forming region;
    a first insulating film formed on the active layer;
    a floating gate formed on the first insulating film;
    a second insulating film formed on the floating gate; and
    a control gate formed on the second insulating film,
    wherein a concentration of impurity elements in the first region is lager than a concentration of impurity elements in the second region;
    wherein a thickness of the first insulating film on the second region is thinner than a thickness of the second insulating film on the first region.

8. A microprocessor according to claim 7, wherein a threshold of the first region is lager than a threshold of the second region.

9. A semiconductor device comprising an involatile memory comprising a memory transistor, a correction circuit, a source signal side drive circuit, a gate signal side drive circuit, a pixel portion, the memory transistor comprising:
- an active layer comprising a drain region, a source region, and a channel forming region formed over a substrate;
- a first region and a second region formed in the channel forming region;
- a first insulating film formed on the active layer;
- a floating gate formed on the first insulating film;
- a second insulating film formed on the floating gate; and
- a control gate formed on the second insulating film,
- wherein a concentration of impurity elements in the first region is lager than a concentration of impurity elements in the second region;
- wherein a thickness of the first insulating film on the second region is thinner than a thickness of the second insulating film on the first region.

10. A semiconductor device according to claim 9, wherein a threshold of the first region is lager than a threshold of the second region.

11. A microprocessor comprising a CPU core, a cache memory, a flush memory, a clock controller, a cache controller, and a serial interface, an I/O port, at least one of the cache memory and the flush memory comprising:
- an active layer comprising a first channel forming region interposed between a source region and a source/drain region and a second channel forming region interposed between the source/drain region and a drain region formed over a substrate;
- a first insulating film formed on the active layer;
- a first floating gate and a second floating gate formed on the first insulating film;
- a second insulating film formed on the first and the second floating gates;
- a first control gate and a second control gate formed on the second insulating film;
- wherein a concentration of impurity elements in the first channel forming region is lager than a concentration of impurity elements in the second channel forming region; and
- wherein a thickness of the first insulating film on the second channel forming region is thinner a thickness of the first insulating film on the first channel forming region.

12. A microprocessor according to claim 11, wherein a threshold of the first channel forming region is lager than a threshold of the second channel forming region.

13. A semiconductor device comprising an involatile memory comprising a memory transistor, a correction circuit, a source signal side drive circuit, a gate signal side drive circuit, a pixel portion, the memory transistor comprising:
- an active layer comprising a first channel forming region interposed between a source region and a source/drain region and a second channel forming region interposed between the source/drain region and a drain region formed over a substrate;
- a first insulating film formed on the active layer;
- a first floating gate and a second floating gate formed on the first insulating film;
- a second insulating film formed on the first and the second floating gates;
- a first control gate and a second control gate formed on the second insulating film;
- wherein a concentration of impurity elements in the first channel forming region is lager than a concentration of impurity elements in the second channel forming region; and
- wherein a thickness of the first insulating film on the second channel forming region is thinner a thickness of the first insulating film on the first channel forming region.

14. A semiconductor device according to claim 13, wherein a threshold of the first channel forming region is lager than a threshold of the second channel forming region.

* * * * *

UNITED STATES PATENT AND TRADEMARK OFFICE
CERTIFICATE OF CORRECTION

PATENT NO. : 6,621,130 B2  Page 1 of 1
DATED : September 16, 2003
INVENTOR(S) : Yoshiyuki Kurokawa and Kiyoshi Kato It is certified that error appears in the above-identified patent and that said Letters Patent is hereby corrected as shown below:

Column 20,
Lines 35 and 50, delete "of",

Column 22,
Lines 10, 11, 42 and 43, delete "of";

Signed and Sealed this

Eleventh Day of November, 2003

JAMES E. ROGAN
*Director of the United States Patent and Trademark Office*